United States Patent
Kim et al.

(10) Patent No.: US 7,659,597 B2
(45) Date of Patent: Feb. 9, 2010

(54) INTEGRATED CIRCUIT WIRE PATTERNS INCLUDING INTEGRAL PLUG PORTIONS

(75) Inventors: Seong-Goo Kim, Seoul (KR); Yun-Gi Kim, Gyeonggi-do (KR); Jae-Man Yoon, Seoul (KR); Hyeoung-Won Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 172 days.

(21) Appl. No.: 11/675,829

(22) Filed: Feb. 16, 2007

(65) Prior Publication Data
US 2008/0067697 A1    Mar. 20, 2008

(30) Foreign Application Priority Data
Sep. 20, 2006    (KR)  .................. 10-2006-0091453

(51) Int. Cl.
H01L 23/52 (2006.01)
H01L 21/336 (2006.01)
(52) U.S. Cl. .................. 257/508; 257/520; 257/775; 257/774; 257/E29.12; 438/270; 438/638; 438/361
(58) Field of Classification Search ............. 257/775, 257/774, 773, E29.12, E29.131, 508, 520; 438/270, 638, 361
See application file for complete search history.

(56) References Cited

U.S. PATENT DOCUMENTS

| | | | |
|---|---|---|---|
| 5,656,543 A | | 8/1997 | Chung |
| 5,834,369 A | * | 11/1998 | Murakami et al. ........... 438/625 |
| 6,040,627 A | * | 3/2000 | Harada et al. ............... 257/752 |
| 6,617,213 B2 | * | 9/2003 | Hummler ..................... 438/270 |
| 2004/0135176 A1 | * | 7/2004 | Kim .............................. 257/243 |
| 2004/0140568 A1 | * | 7/2004 | Fukazawa ..................... 257/774 |
| 2006/0017099 A1 | * | 1/2006 | Paik ............................. 257/330 |

FOREIGN PATENT DOCUMENTS

| | | |
|---|---|---|
| KR | 1020050025516 A | 3/2005 |
| KR | 1020060041126 A | 5/2006 |
| KR | 1020060041753 A | 5/2006 |

OTHER PUBLICATIONS

Decision to Grant Patent corresponding to Korean Application No. 10-2006-0091453, issued Sep. 28, 2007.

* cited by examiner

Primary Examiner—Kimberly D Nguyen
Assistant Examiner—Maria Ligai
(74) Attorney, Agent, or Firm—Myers Bigel Sibley & Sajovec, P.A.

(57) ABSTRACT

An integrated circuit device includes a substrate including a trench therein and a conductive plug wire pattern in the trench. The conductive plug wire pattern includes a recessed portion that exposes portions of opposing sidewalls of the trench, and an integral plug portion that protrudes from a surface of the recessed portion to provide an electrical connection to at least one other conductive wire pattern on a different level of metallization. A surface of the plug portion may protrude to a substantially same level as a surface of the substrate adjacent to and outside the trench, and the surface of the recessed portion may be below the surface of the substrate outside the trench. Related fabrication methods are also discussed.

26 Claims, 26 Drawing Sheets

INTEGRATED CIRCUIT WIRE PATTERNS INCLUDING INTEGRAL PLUG PORTIONS

CROSS-REFERENCE TO RELATED APPLICATION

This application claims priority from Korean Application Serial No. 10-2006-0091453, filed Sep. 20, 2006, the disclosure of which is hereby incorporated herein by reference in its entirety.

FIELD OF THE INVENTION

The present invention relates to integrated circuit devices, and more particularly, to wiring in integrated circuit devices and related methods of fabrication.

BACKGROUND OF THE INVENTION

Integrated circuit wire and/or transistor fabrication may be important issues in research for enhancing electrical characteristics of semiconductor devices. For example, transistors may be fabricated using manufacturing processes that may be similar to that of integrated circuit wires or traces. To this end, the manufacturing process may provide transistors with gate electrodes defined in a predetermined region of a substrate. Accordingly, the transistor may have enhanced current driving capability by using a larger channel region than when a gate electrode is formed on the predetermined region of the semiconductor substrate.

However, conventional manufacturing processes may not be easily adapted to provide structures which may allow integrated circuit wires to be electrically connected to other integrated circuit wires, for example, on different levels of metallization. This is because conventional manufacturing processes may use connection holes and/or vias to electrically connect the integrated circuit wires on different levels. The connection holes may be defined by an insulating layer on the substrate. Accordingly, in order to electrically connect the integrated circuit wires to each other, the manufacturing processes may additionally employ a semiconductor deposition technique associated with the insulating layer, and semiconductor photolithography and etching techniques associated with the connection hole.

Metal wires electrically connected through connection holes in an insulating layer are disclosed in U.S. Pat. No. 5,834,369 to Tomoyasu Murakami et al. According to U.S. Pat. No. 5,834,369, a lower metal wire is formed on a substrate. An insulating layer is formed on the substrate to cover the lower metal wire. A connection hole is formed in the insulating layer to expose the lower metal wire. A tungsten plug is formed in the connection hole. An upper metal wire partially in contact with the tungsten plug is formed on the insulating layer.

SUMMARY OF THE INVENTION

According to some embodiments of the present invention, an integrated circuit device includes a substrate including a trench therein, and a conductive plug wire pattern in the trench. The plug wire pattern includes a recessed portion that exposes portions of opposing sidewalls of the trench, and an integral plug portion that protrudes from a surface of the recessed portion to provide an electrical connection to at least one other conductive wire pattern on a different level of metallization.

In some embodiments, a surface of the plug portion may protrude to a substantially same level as a surface of the substrate adjacent to and outside the trench. Also, the surface of the recessed portion may be below the surface of the substrate outside the trench. The surface of the substrate adjacent to and outside the trench may be a major surface of the substrate.

In other embodiments, the device may include an insulating plug spacer layer in the trench. The plug spacer layer may be on the surface of the recessed portion of the conductive plug wire pattern and on a sidewall of the plug portion. The plug spacer layer may substantially cover the portions of the opposing sidewalls of the trench exposed by the recessed portion of the plug wire pattern, and may expose a surface of the plug portion to provide the electrical connection to the at least one other conductive wire pattern.

In some embodiments, the plug spacer layer may fill the trench such that a surface thereof is at a substantially same level as the surface of the substrate adjacent to and outside the trench.

In other embodiments, the plug spacer layer may be formed of a different material than the substrate.

In some embodiments, the plug spacer layer may further extend on a sidewall of the at least one other conductive wire pattern.

In other embodiments, the device may include a conductive circuit wire pattern directly on the plug portion of the plug wire pattern. The conductive circuit wire pattern may expose the recessed portion of the plug wire pattern.

In some embodiments, the substrate may be an insulating molding layer, and the conductive plug wire pattern may be a conductive trace.

In other embodiments, the substrate may be a semiconductor substrate, and the plug wire pattern may be a gate pattern. In addition, the device may include a device isolation layer on the substrate defining an active region in the substrate. The trench may extend through portions of the active region and portions of the isolation layer. A gate insulating layer may be provided in the trench on the sidewalls thereof and a surface therebetween such that the gate insulating layer may be between the gate pattern and the trench. The recessed portion of the gate pattern may expose portions of the gate insulating layer on the sidewalls of the trench. Impurity diffusion regions may be provided in the active region of the substrate on opposite sides of the trench adjacent the gate pattern and having a different conductivity type than that of the substrate.

According to other embodiments of the present invention, a method of forming an integrated circuit device includes forming a trench in a substrate, and forming a conductive plug wire pattern in the trench. The plug wire pattern includes a recessed portion that exposes portions of opposing sidewalls of the trench, and an integral plug portion that protrudes from a surface of the recessed portion to provide an electrical connection to at least one other conductive wire pattern on a different level of metallization.

In some embodiments, forming the conductive plug wire pattern may include forming a conductive layer in the trench, forming a mask pattern on the conductive layer to expose a portion thereof, and selectively recessing the exposed portion of the conductive layer to expose the portions of the opposing sidewalls of the trench and define the recessed portion of the conductive plug wire pattern and the plug portion protruding therefrom.

In other embodiments, the conductive layer may be formed to substantially fill the trench. The exposed portion of the conductive layer may be selectively etched such that the recessed portion of the plug wire pattern is below a surface of the substrate adjacent to and outside the trench, and such that a surface of the plug portion protrudes to a substantially same level as the surface of the substrate adjacent to and outside the trench. The surface of the substrate adjacent to and outside the trench may be a major surface of the substrate.

In some embodiments, the conductive layer may be formed on a surface of the substrate outside the trench, and exposed portions of the conductive layer outside the trench may be recessed to define a conductive circuit wire pattern on the plug portion of the conductive plug wire pattern. The circuit wire pattern may expose the recessed portion of the plug wire pattern in the trench.

In other embodiments, prior to forming the mask pattern, a second conductive layer may be formed directly on the first conductive layer and on a surface of the substrate outside the trench. The mask pattern may be formed on the second conductive layer to expose a portion thereof, and the exposed portion of the second conductive layer and the first conductive layer may be sequentially recessed to define a conductive circuit wire pattern directly on the plug portion of the conductive plug wire pattern. The conductive circuit wire pattern may expose the recessed portion of the plug wire pattern in the trench.

In some embodiments, the second conductive layer and the first conductive layer may be formed of different materials.

According to some other embodiments of the present invention, a transistor may include an isolation layer disposed in a semiconductor substrate. The isolation layer may define an active region. A plug wire may be surrounded by the active region and the isolation layer. A wire connection electrode may be disposed on the plug wire to expose the plug wire. A plug spacer may be disposed on the plug wire to cover a sidewall of the wire connection electrode.

In other embodiments of the present invention, an integrated circuit wire may include a molding layer disposed on the semiconductor substrate. A plug wire may be surrounded by the molding layer. A wire connection electrode may be disposed on the plug wire to expose the plug wire. A plug spacer may be disposed on the plug wire to cover a sidewall of the wire connection electrode.

In still other embodiments of the present invention, a method of forming a transistor may include forming an isolation layer in a semiconductor substrate. The isolation layer may define an active region. A channel trench may be formed in the active region and the isolation layer. A plug wire and a wire connection electrode may be simultaneously formed in the channel trench and above the channel trench, respectively. The wire connection electrode may be in contact with the plug wire while exposing the plug wire. A plug spacer may be disposed on a sidewall of the wire connection electrode to cover the plug wire.

In yet other embodiments of the present invention, a method of forming an integrated circuit wire may include forming a molding layer on a semiconductor substrate. A molding trench may be formed in the molding layer. A plug wire and a wire connection electrode may be simultaneously formed in the molding trench and above the molding trench, respectively. The wire connection electrode may be in contact with the plug wire while exposing the plug wire. A plug spacer may be disposed on a sidewall of the wire connection electrode to cover the plug wire.

DETAILED DESCRIPTION OF EMBODIMENTS OF THE INVENTION

Figure 1:
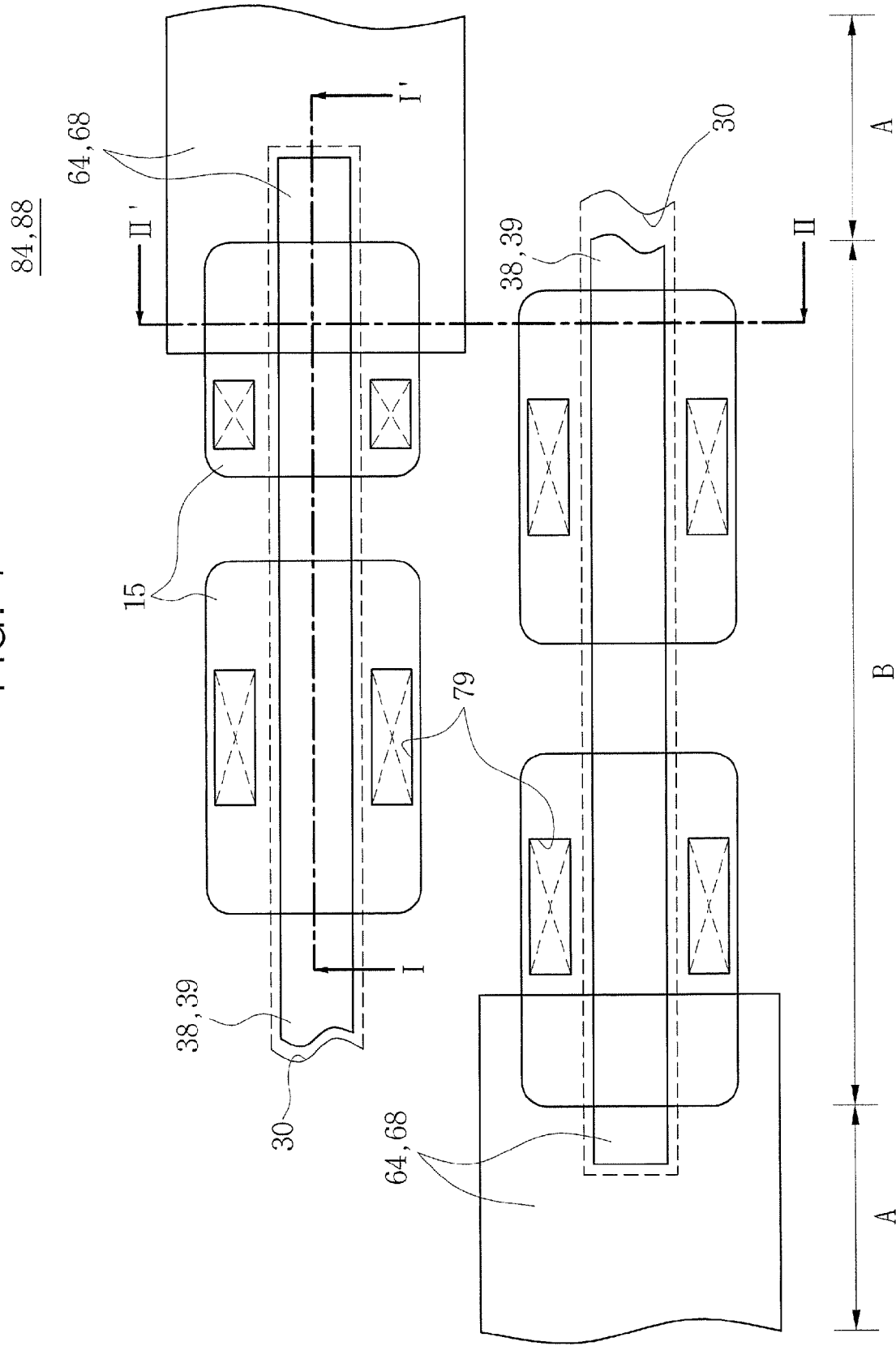
FIG. 1 is a layout view illustrating transistors in accordance with some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Transistors according to some embodiments of the present invention will now be described in more detail with reference to the accompanying drawings.

Figure 15:
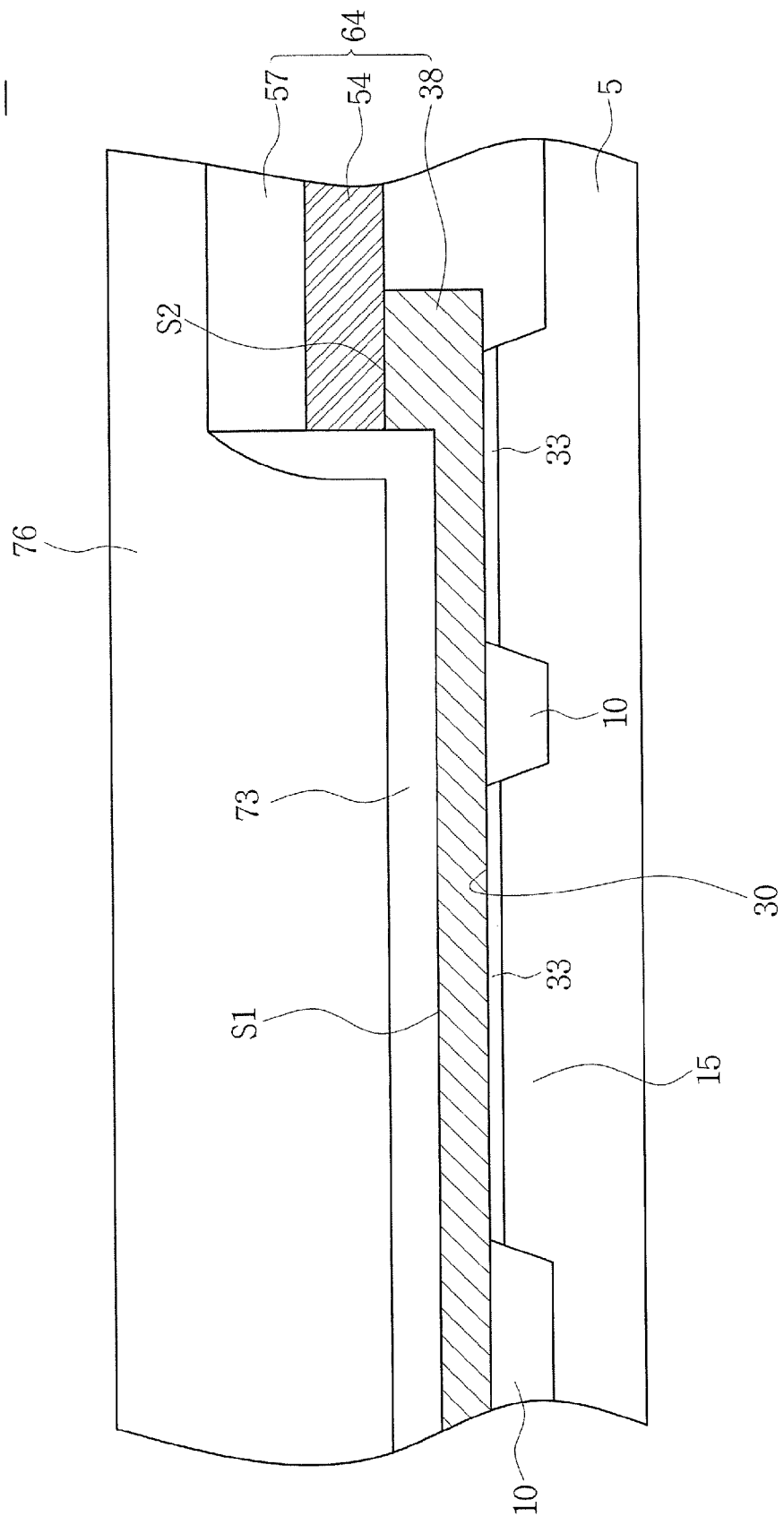
Figure 16:
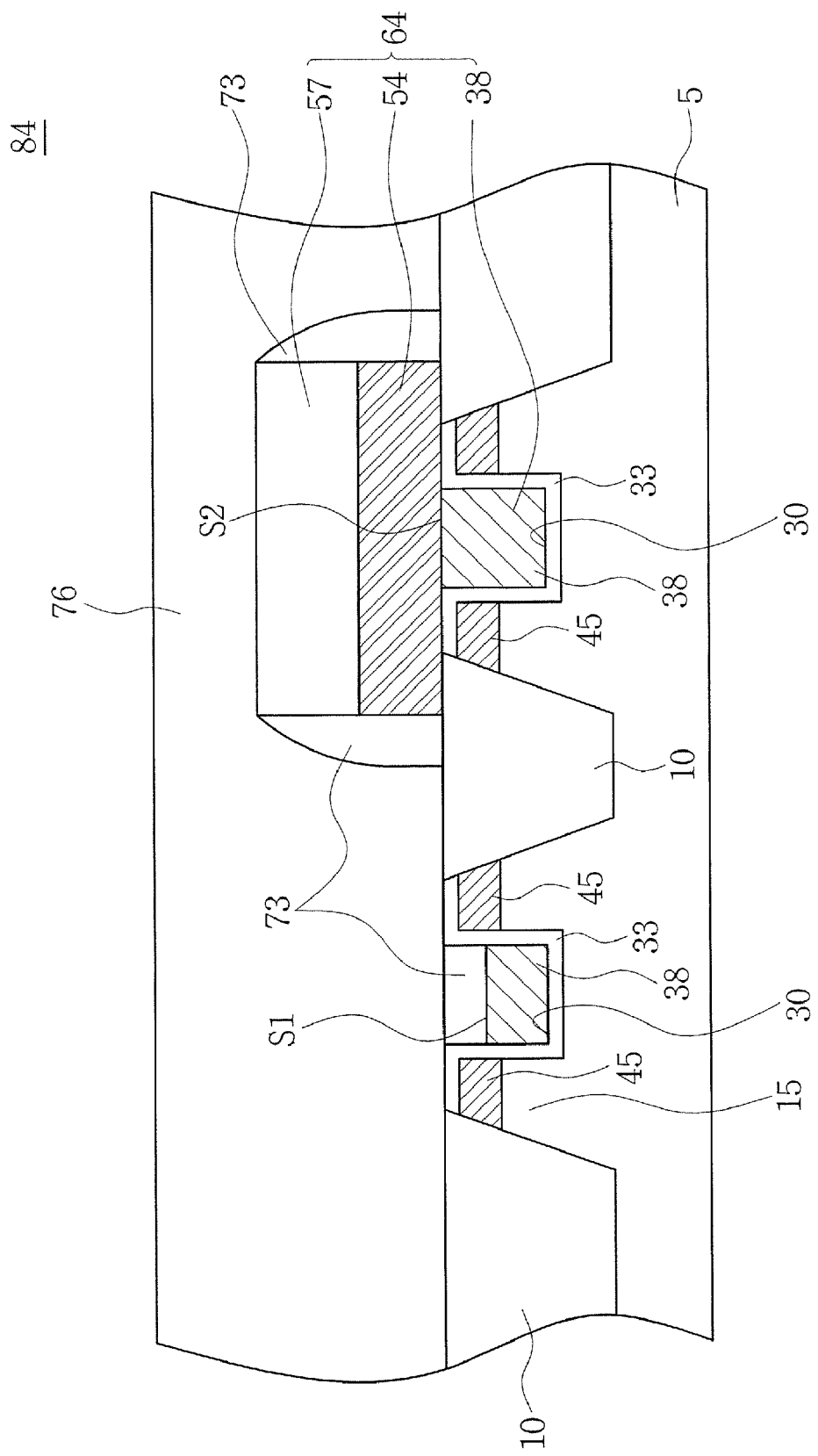
Figure 23:
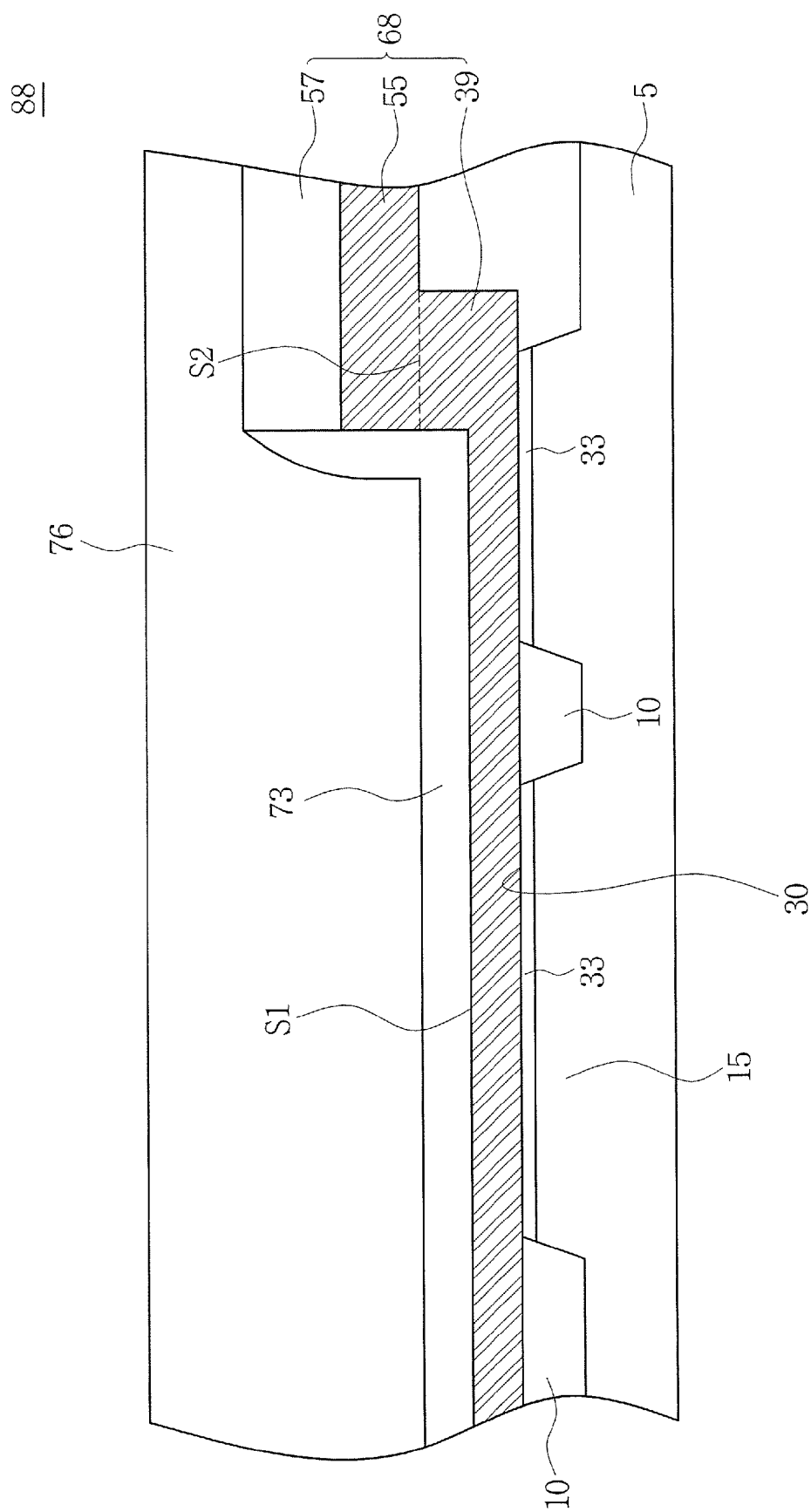
Figure 24:
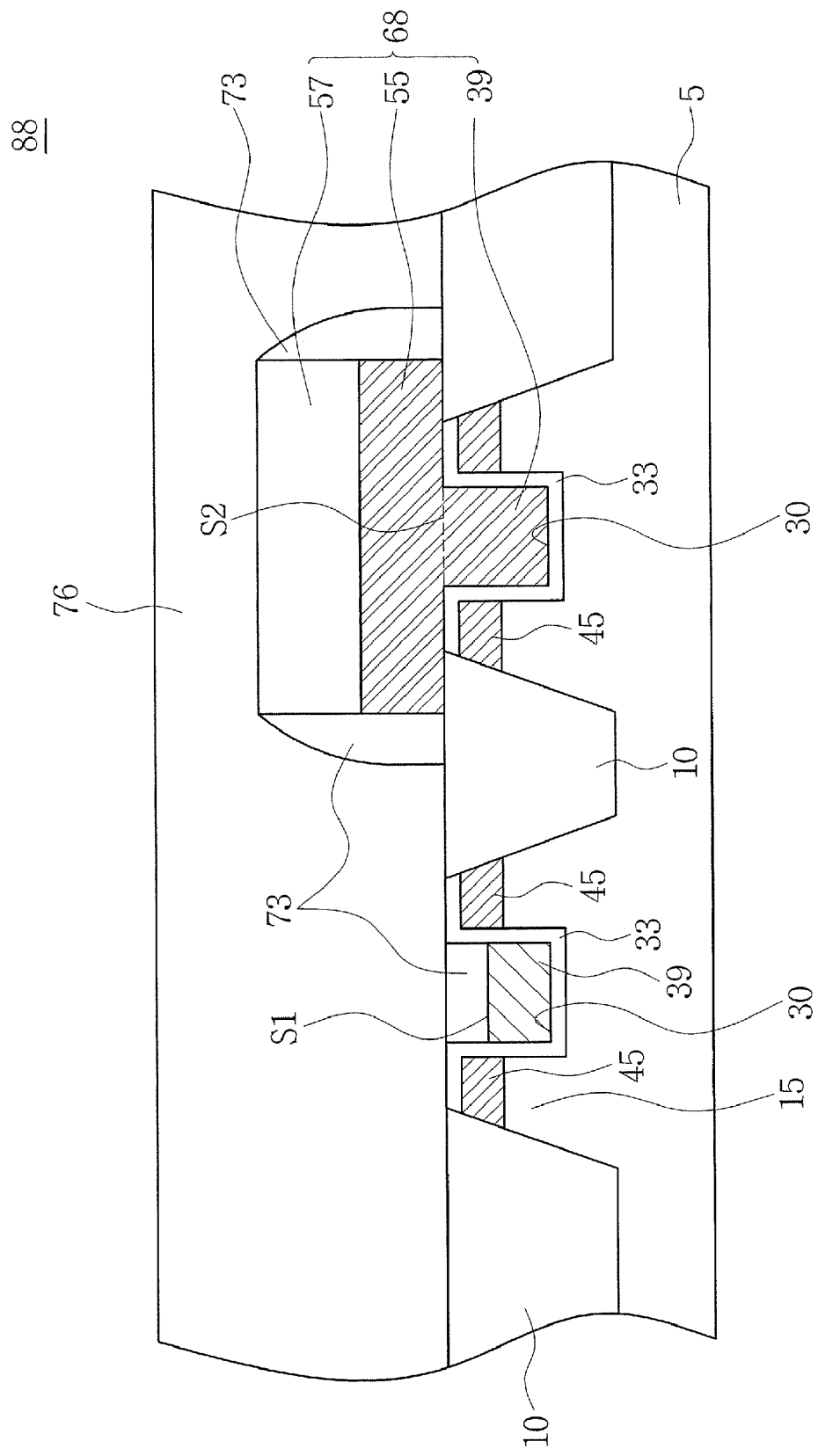

FIG. 1 is a layout view showing transistors in accordance with some embodiments of the present invention, FIGS. 15 and 16 are cross-sectional views of a transistor taken along lines I-I' and II-II' of FIG. 1, respectively, in accordance with some embodiments of the present invention, and FIGS. 23 and 24 are cross-sectional views of a transistor taken along lines I-I' and II-II' of FIG. 1, respectively, in accordance with other embodiments of the present invention.

Referring now to FIGS. 1, 15, 16, 23 and 24, each transistor 84 and 88 includes a semiconductor substrate 5 having a core region A and a cell array region B. The cell array region B may be surrounded by the core region A. An isolation layer 10 is disposed in the semiconductor substrate 5 as shown in FIGS. 15, 16, 23, and 24. The isolation layer 10 may be disposed over the core region A and the cell array region B. The core region A and the cell array region B may be replaced by selected other regions on the semiconductor substrate 5.

The isolation layer 10 may be disposed in the semiconductor substrate 5 to define at least one active region 15. The isolation layer 10 may be an insulating material. The isolation layer 10 may be, for example, a silicon oxide ($SiO_2$) layer, a silicon nitride ($Si_3N_4$) layer or a combination thereof. The semiconductor substrate 5 may have N- or P-type conductivity.

At least one plug wire or plug wire pattern 38 is disposed in a trench in the semiconductor substrate 5 as shown in FIGS. 1, 15, and 16 in accordance with the first embodiment. The plug wire pattern 38 is a gate electrode of the transistor 84. In addition, at least one plug wire or plug wire pattern 39 is disposed in the semiconductor substrate 5 as shown in FIGS. 1, 23, and 24 in accordance with the second embodiment. The plug wire pattern 39 is a gate electrode of the transistor 88 of FIG. 1. Each of the plug wire patterns 38 and 39 is at least partially surrounded by portions of the isolation layer 10 and/or the active region 15. The plug wire patterns 38 and 39 are disposed only in the cell array region B.

Each of the plug wire patterns 38 and 39 includes a recessed portion having a first top surface S1 and a protruding plug portion having a second top surface S2 disposed at different levels from each other, as shown in FIGS. 1, 16, and 24. The first top surface S1 of each of the plug wire patterns 38 and 39 may be disposed at a level lower than a top surface of the active region 15 outside the trench. The second top surface S2 of each of the plug wire patterns 38 and 39 may be disposed substantially at the same level as the top surface of the active region 15 outside the trench. The plug wire patterns 38 and 39 may be formed of a conductive material. The plug wire patterns 38 and 39 may be, for example, doped polysilicon, metal nitride, or a combination thereof.

Referring back to FIGS. 1, 15, 16, 23, and 24, a wire connection electrode 54 is disposed on the plug portion of the plug wire pattern 38 as shown in FIGS. 15 and 16. The wire connection electrode 54 extends from the second top surface S2 of the plug wire pattern 38 to the isolation layer 10 of the core region A. In addition, a wire connection electrode 55 is disposed on the plug portion of the plug wire pattern 39 as shown in FIGS. 23 and 24. The wire connection electrode 55 extends from the second top surface S2 of the plug wire pattern 39 to the isolation layer 10 of the core region A. The wire connection electrodes 54 and 55 are circuit wire patterns of the core region A which supply power to the plug wire patterns 38 and 39, respectively.

The wire connection electrodes 54 and 55 may expose the recessed portions of the plug wire patterns 38 and 39, respectively. The wire connection electrodes 54 and 55 may be formed of a conductive material. The wire connection electrodes 54 and 55 may be, for example, doped polysilicon, metal nitride, or a combination thereof. The wire connection electrode 54 may be a conductive material different from the plug wire pattern 38, as shown in FIGS. 15 and 16. The wire connection electrode 54 may also be the same conductive material as the plug wire pattern 38. The wire connection electrode 55 may be formed of the same conductive material as the plug wire pattern 39, as shown in FIGS. 23 and 24. A wire capping pattern 57 may be disposed on each of the wire connection electrodes 54 and 55, as shown in FIGS. 15, 16, 23, and 24.

The wire capping pattern 57 along with the wire connection electrode 54 and the plug wire pattern 38 form a wire pattern 64 as shown in FIGS. 1, 15, and 16 in accordance with some embodiments. In addition, the wire capping pattern 57 along with the wire connection electrode 55 and the plug wire pattern 39 form a wire pattern 68 as shown in FIGS. 1, 23, and 24 in accordance with other embodiments. Accordingly, each of the wire patterns 64 and 68 may have a predetermined length and may be disposed in both the core region A and the cell array region B. The wire capping pattern 57 may be an insulating material. For example, the wire capping pattern 57 may be silicon oxide or silicon nitride.

Again referring back to FIGS. 1, 15, 16, 23 and 24, a plug spacer 73 is formed on the plug wire pattern 38 to cover sidewalls of the wire capping pattern 57 and the wire connection electrode 54 as shown in FIGS. 15 and 16. In addition, the plug spacer 73 is formed on the plug wire pattern 39 to cover sidewalls of the wire capping pattern 57 and the wire connection electrode 55 as shown in FIGS. 23 and 24.

The plug spacer 73 is disposed at substantially the same level as the top surface of the active region 15 outside the trench and/or the second top surface S2 of the plug portions of each of the plug wire patterns 38 and 39. The plug spacer 73 may be an insulating material having an etch rate that is different from that of the isolation layer 10. In some embodiments, the plug spacer 73 may be formed of the same material as the wire capping pattern 57.

Each of the wire connection electrodes 54 and 55 may overlap and/or cover portions of the active region 15 as shown in FIGS. 1, 15, 16, 23, and 24. Each of the wire connection electrodes 54 and 55 may be spaced apart from the active region 15. Diffusion regions 45 may be disposed in the active region 15. The diffusion regions 45 may overlap the plug wire patterns 38 and 39 as shown in FIGS. 15, 16, 23, and 24. The diffusion regions 45 may have a different conductivity from that of the semiconductor substrate 5.

Integrated circuit wire patterns according to some embodiments of the present invention will now be described with reference to FIGS. 2, 17, 18, 25, and 26.

Figure 2:
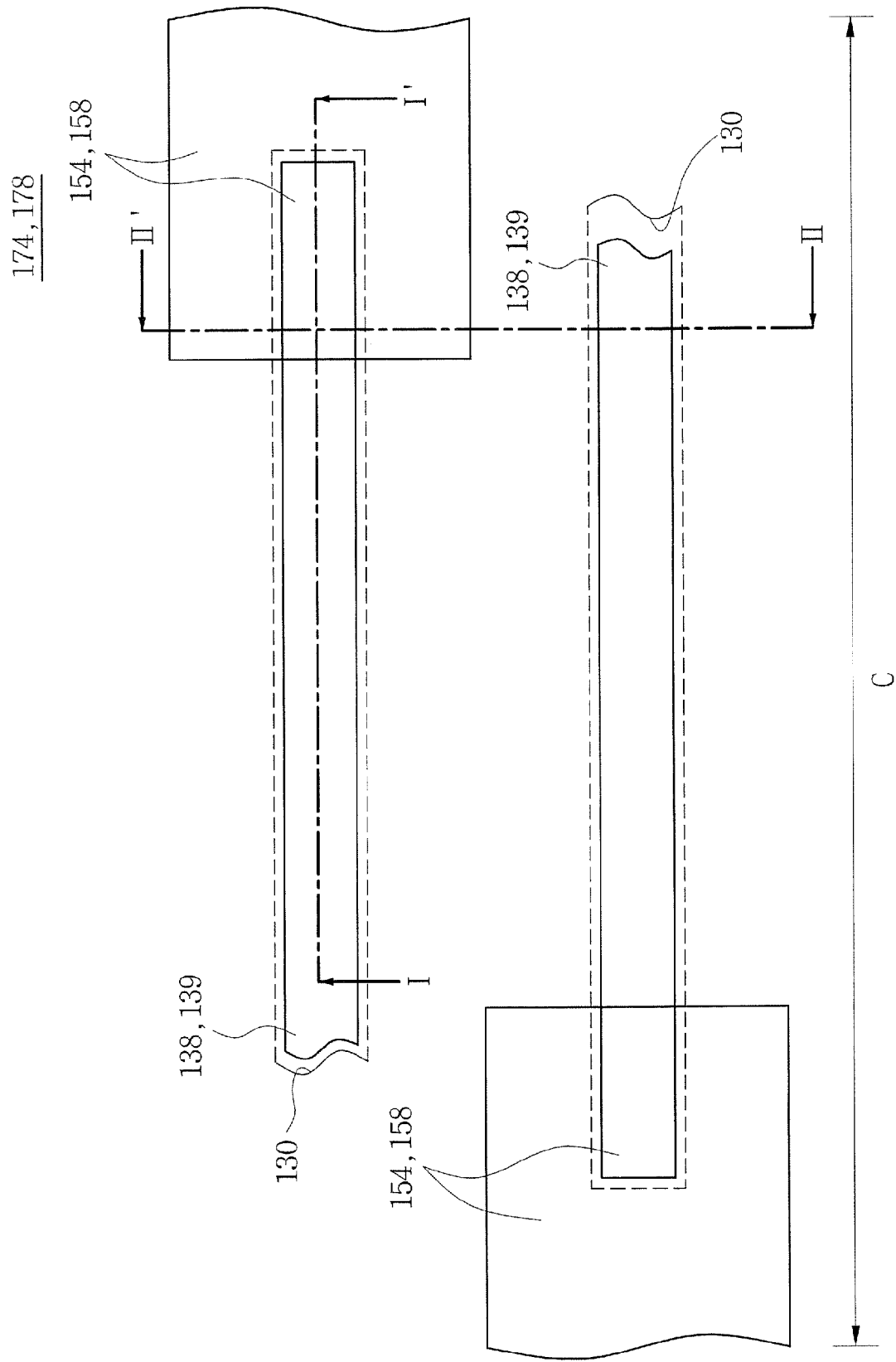
FIG. 2 is a layout view illustrating integrated circuit wires in accordance with some embodiments of the present invention.
Figure 17:
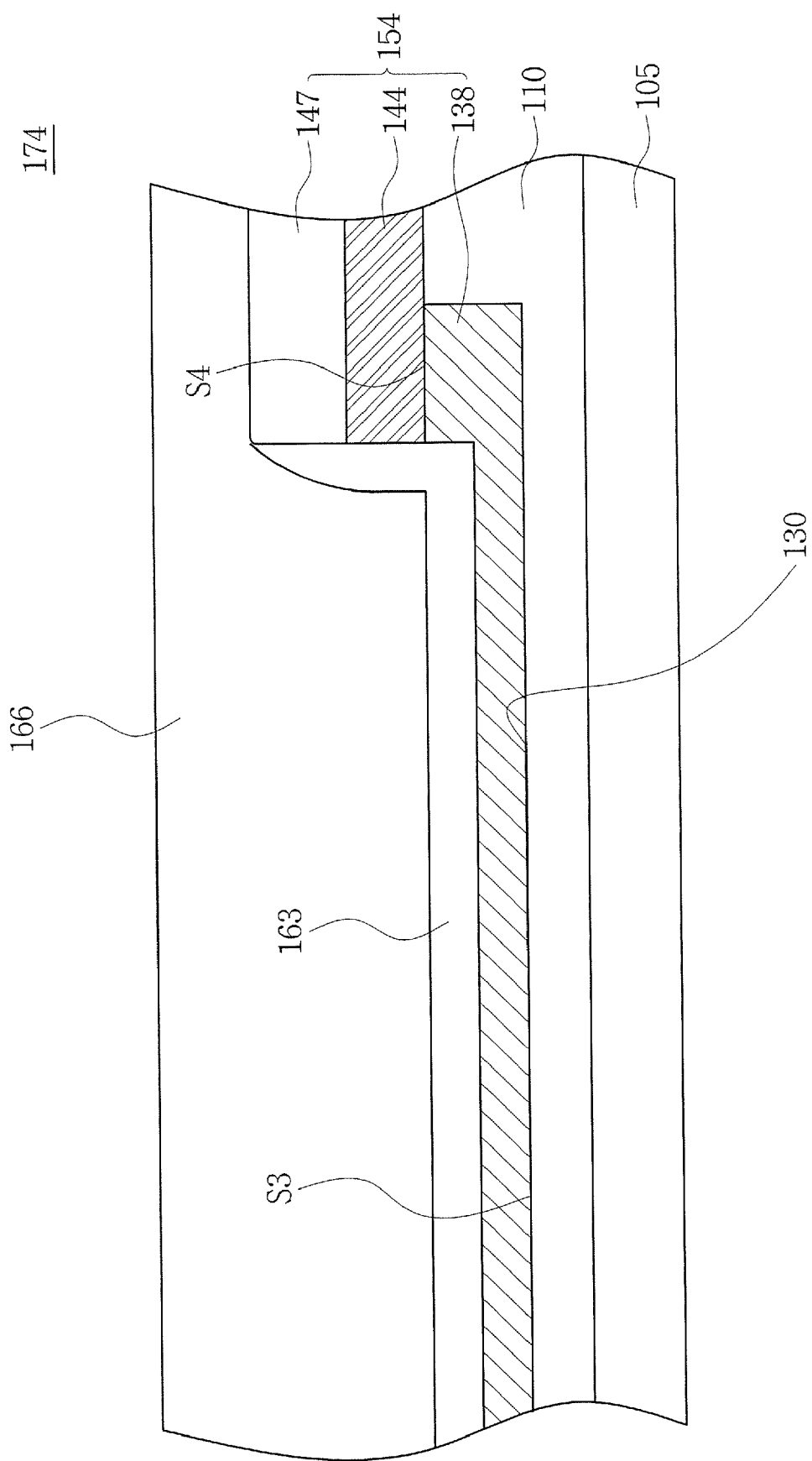
Figure 18:
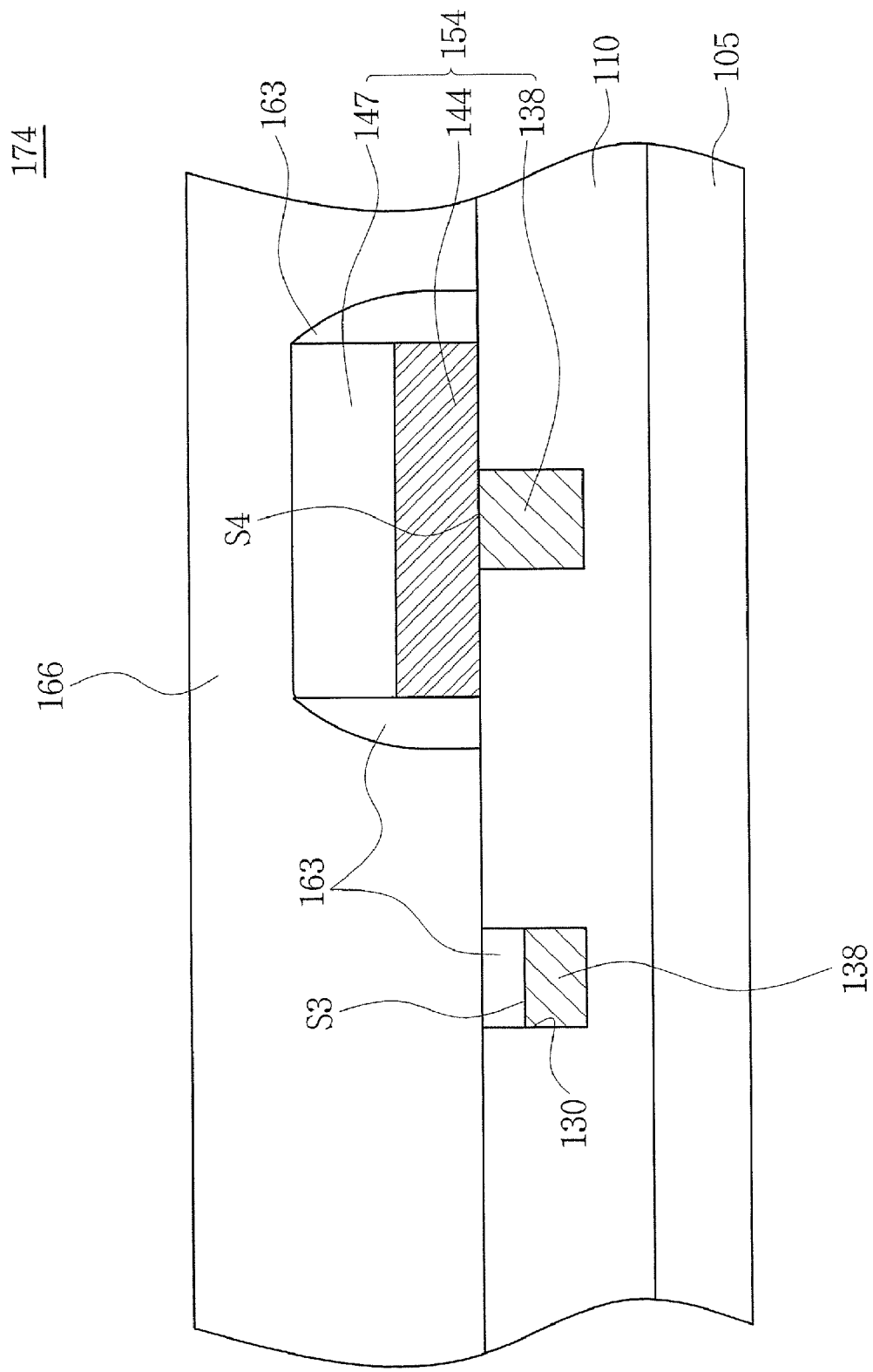
Figure 25:
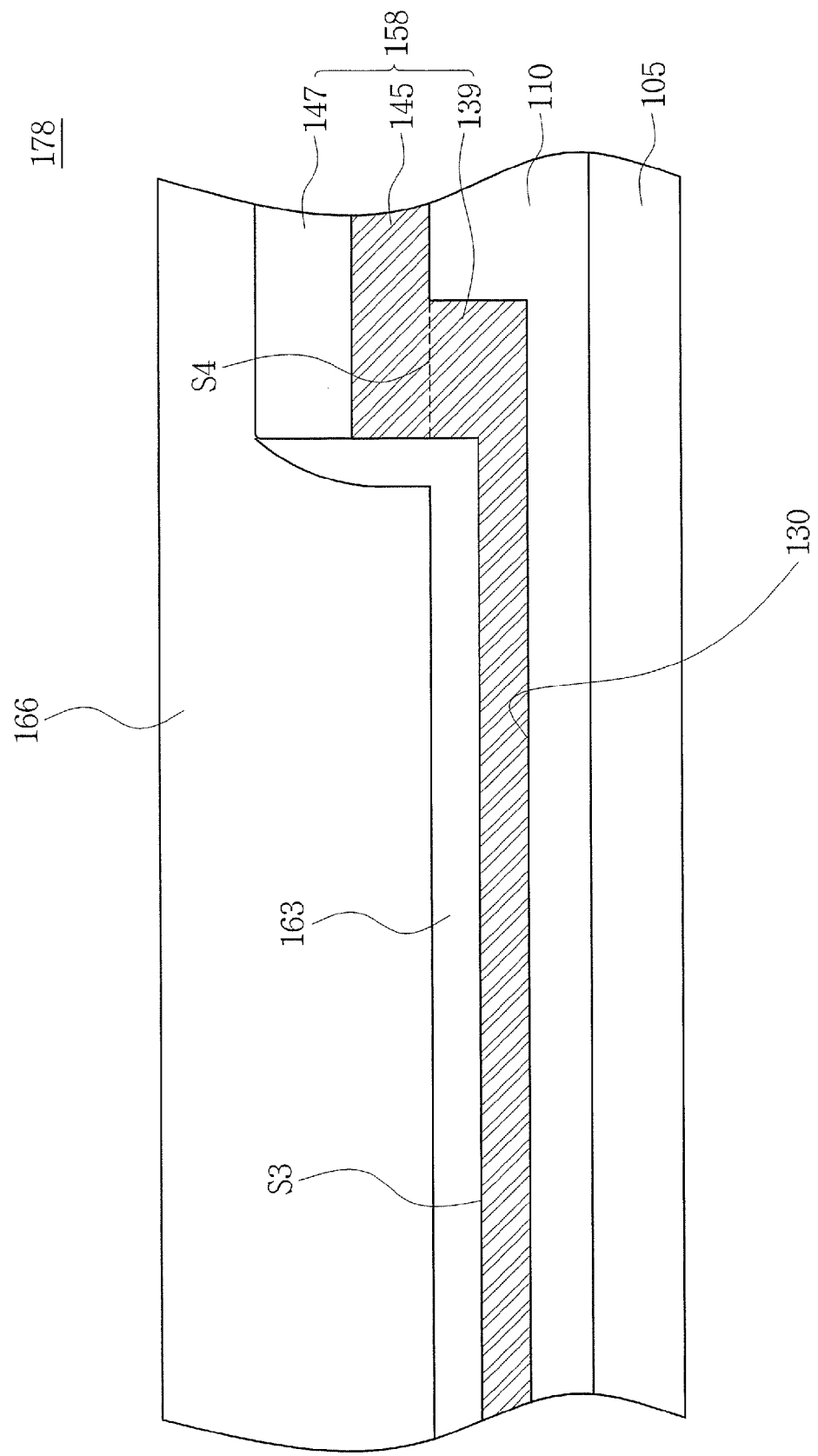
Figure 26:
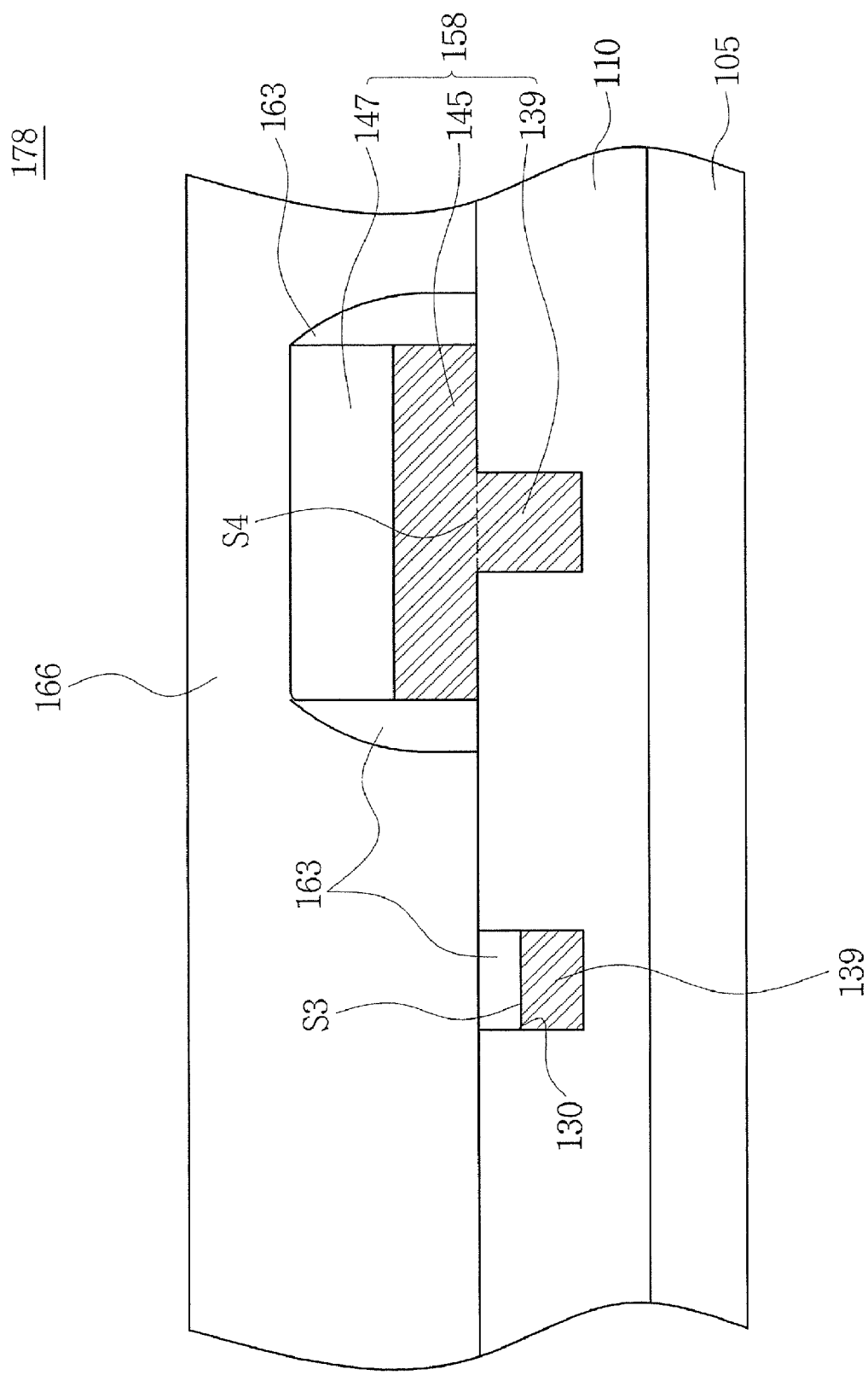

FIG. 2 is a layout view showing integrated circuit wire patterns (also referred to herein as "traces") in accordance with some embodiments of the present invention. FIGS. 17 and 18 are cross-sectional views of integrated circuit wire patterns taken along lines I-I' and II-II' of FIG. 2, respectively, in accordance with some embodiments of the present invention, and FIGS. 25 and 26 are cross-sectional views of integrated circuit wire patterns taken along lines I-I' and II-II' of FIG. 2, respectively, in accordance with other embodiments of the present invention.

Referring to FIGS. 2, 17, 18, 25, and 26, each integrated circuit wire pattern 174 and 178 of the present invention includes a semiconductor substrate 105 having a selected region C. The selected region C may be a cell array region or a peripheral circuit region. The semiconductor substrate 105 may have a N- or P-type conductivity. A molding layer 110 is disposed on the semiconductor substrate 105. The molding layer 110 may be an insulating material. The molding layer 110 may be silicon oxide. The molding layer 110 may also be an insulating material including at least one of metal and non-metal atoms in a lattice of silicon oxide.

At least one plug wire pattern 138 is disposed in a trench in the molding layer 110 as shown in FIGS. 2, 17, and 18. In addition, at least one plug wire pattern 139 is disposed in the molding layer 110 as shown in FIGS. 2, 25, and 26. Each of the plug wire patterns 138 and 139 is at least partially surrounded by portions of the molding layer 110.

Each of the plug wire patterns 138 and 139 may include a recessed portion having a first top surface S3 and a protruding plug portion having a second top surface S4 disposed at different levels from each other. The first top surface S3 of each of the plug wire patterns 138 and 139 may be disposed at a level lower than the top surface of the molding layer 110 outside the trench. The second top surface S4 of each of the plug wire patterns 138 and 139 may be disposed at substantially the same level as the top surface of the molding layer 110 outside the trench. The plug wire patterns 138 and 139 may be formed of a conductive material. The plug wire patterns 138 and 139 may be, for example, doped polysilicon, metal nitride, or a combination thereof.

Referring back to FIGS. 2, 17, 18, 25, and 26, a wire connection electrode 144 is disposed on the plug portion of the plug wire pattern 138 as shown in FIGS. 17 and 18. The wire connection electrode 144 extends from the second top surface S4 of the plug wire pattern 138 to the molding layer 110. In addition, a wire connection electrode 145 is disposed on the plug portion of the plug wire pattern 139 as shown in FIGS. 25 and 26. The wire connection electrode 145 extends from the second top surface S4 of the plug wire pattern 139 to the molding layer 110. The wire connection electrodes 144 and 145 are peripheral circuit wire patterns which supply power to the plug wire patterns 138 and 139, respectively.

The wire connection electrodes 144 and 145 may expose the recessed portions of the plug wire patterns 138 and 139, respectively. The wire connection electrodes 144 and 145 may be formed of a conductive material. The wire connection electrodes 144 and 145 may be, for example, doped polysilicon, metal nitride, or a combination thereof. The wire connection electrode 144 may be conductive material different from the plug wire pattern 138, as shown in FIGS. 17 and 18. The wire connection electrode 145 may be formed of the same conductive material as the plug wire pattern 139, as shown in FIGS. 25 and 26. A wire capping pattern 147 may be disposed on each of the wire connection electrodes 144 and 145, as shown in FIGS. 17, 18, 25, and 26.

The wire capping pattern 147 along with the wire connection electrode 144 and the plug wire pattern 138 forms a wire pattern 154 as shown in FIGS. 1, 17, and 18 in accordance with some embodiments. In addition, the wire capping pattern 147 along with the wire connection electrode 145 and the plug wire pattern 139 forms a wire pattern 158 as shown in FIGS. 1, 25, and 26 in accordance with other embodiments. Accordingly, each of the wire patterns 154 and 158 may have a predetermined length and may be disposed in the selected region C. The wire capping pattern 147 may be an insulating material. The wire capping pattern 147 may be silicon oxide or silicon nitride.

Again referring back to FIGS. 2, 17, 18, 25, and 26, a plug spacer 163 is disposed on the plug wire pattern 138 to cover sidewalls of the wire capping pattern 147 and the wire connection electrode 144 as shown in FIGS. 17 and 18. In addition, the plug spacer 163 is disposed on the plug wire pattern 139 to cover sidewalls of the wire capping pattern 147 and the wire connection electrode 145 as shown in FIGS. 25 and 26. The plug spacer 163 may be disposed at substantially the same level as the top surface of the molding layer 110 on the second top surface S4 of each of the plug wire patterns 138 and 139. The plug spacer 163 may be an insulating material having an etch rate that is different from that of the molding layer 110. In some embodiments, the plug spacer 163 may be formed of the same material as the wire capping pattern 147.

Methods of fabricating transistor devices according to some embodiments of the present invention will now be described with reference to FIGS. 1, 3, 4, 7, 8, 11, 12, 15, and 16.

FIGS. 3, 4, 7, 8, 11, 12, 15, and 16 are cross-sectional views illustrating methods of fabricating a transistor taken along lines I-I' and II-II' of FIG. 1, respectively, in accordance with some embodiments of the present invention.

Figure 3:
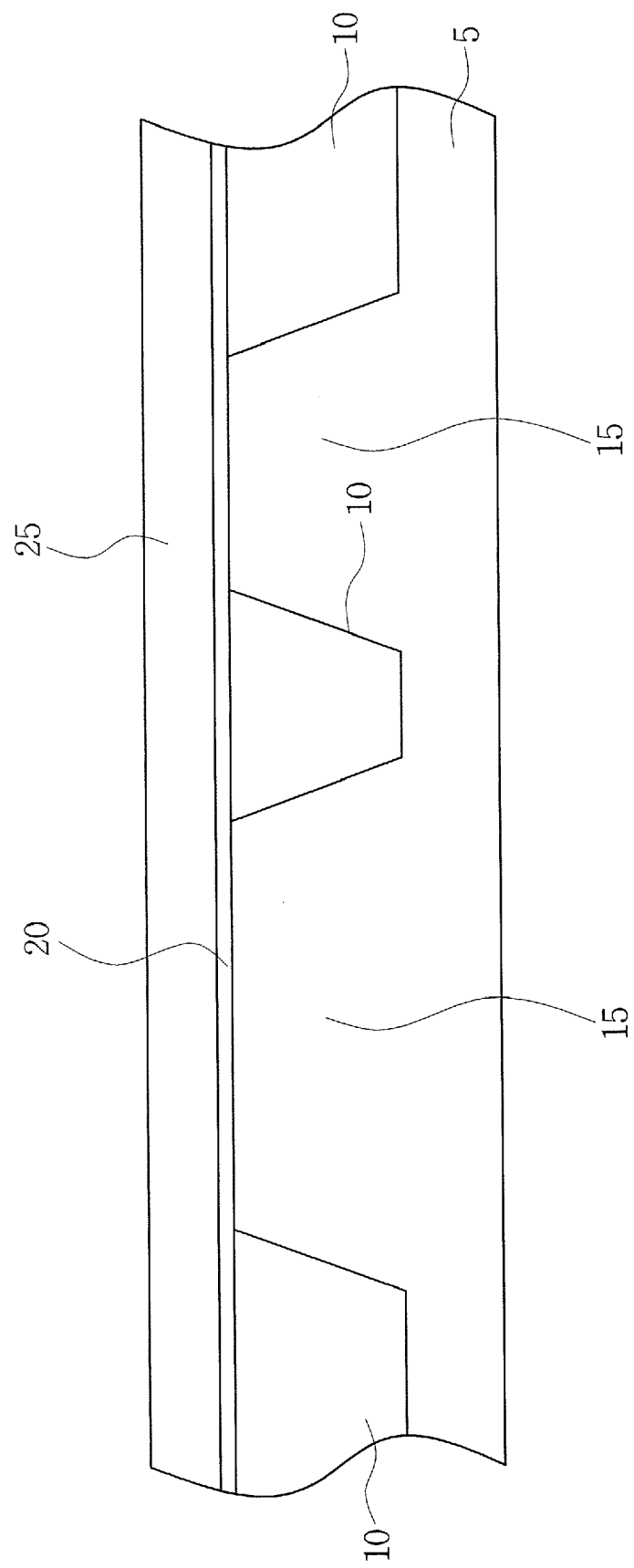
FIGS. 3, 4, 7, 8, 11, 12, 15, and 16 are cross-sectional views illustrating methods of forming a transistor taken along lines I-I' and II-II' of FIG. 1 in accordance with some embodiments of the present invention.
Figure 4:
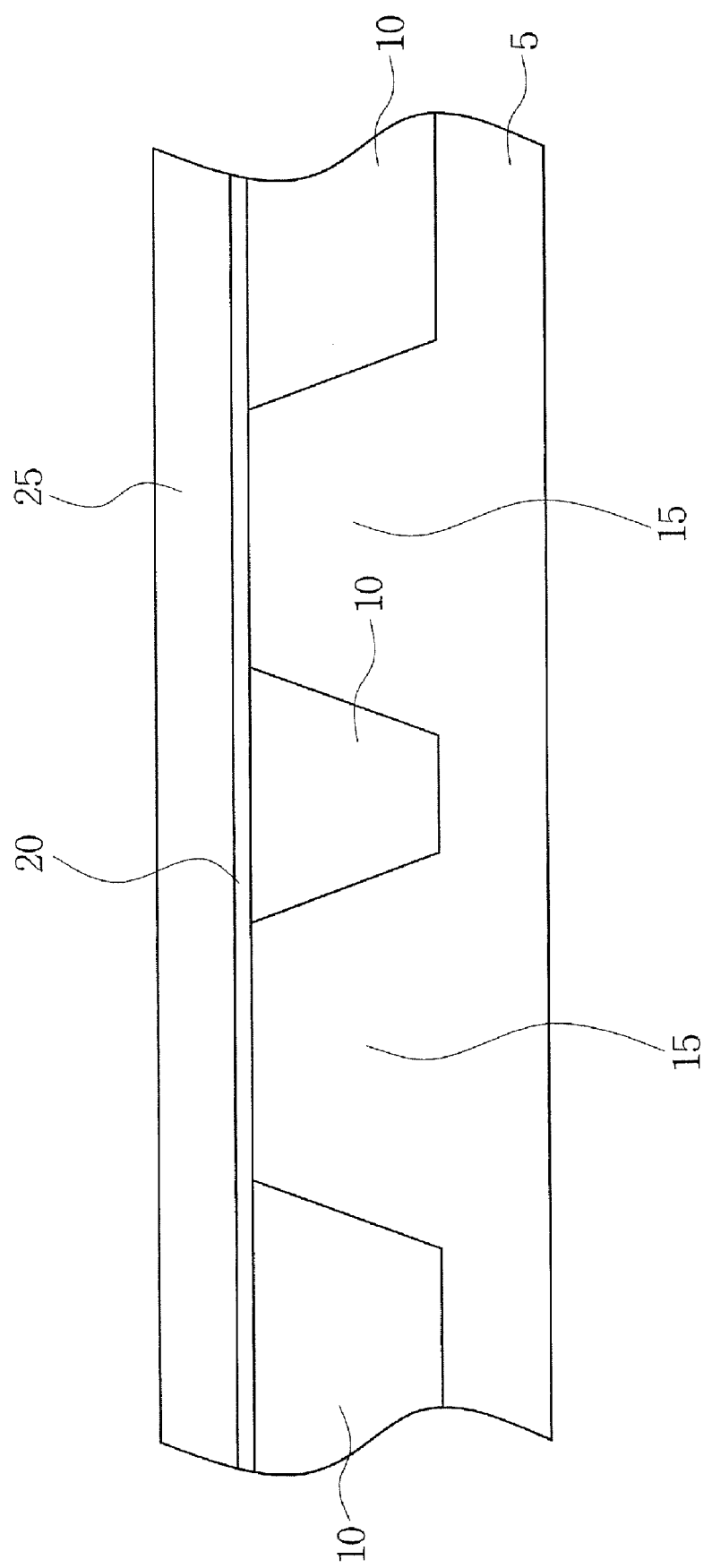

Referring to FIGS. 1, 3, and 4, a semiconductor substrate 5 having a core region A and a cell array region B is provided as shown in FIGS. 3 and 4. The semiconductor substrate 5 is formed to have an N- or P-type conductivity. The cell array region B may be surrounded by the core region A. An isolation layer 10 is formed in the semiconductor substrate 5 as shown in FIGS. 3 and 4. The isolation layer 10 is formed to define at least one active region 15. The isolation layer 10 may be an insulating material. The isolation layer 10 may be formed of silicon oxide, silicon nitride, or a combination thereof.

A buffer layer 20 and a sacrificial layer 25 are sequentially formed on the isolation layer 10 and the active region 15 as shown in FIGS. 3 and 4. The sacrificial layer 25 and the buffer layer 20 may be insulating materials having different etch rates from each other. The sacrificial layer 25 and the buffer layer 20 may be silicon nitride and silicon oxide, respectively. The sacrificial layer 25 and the buffer layer 20 may be photoresist and silicon oxide, respectively.

Figure 7:
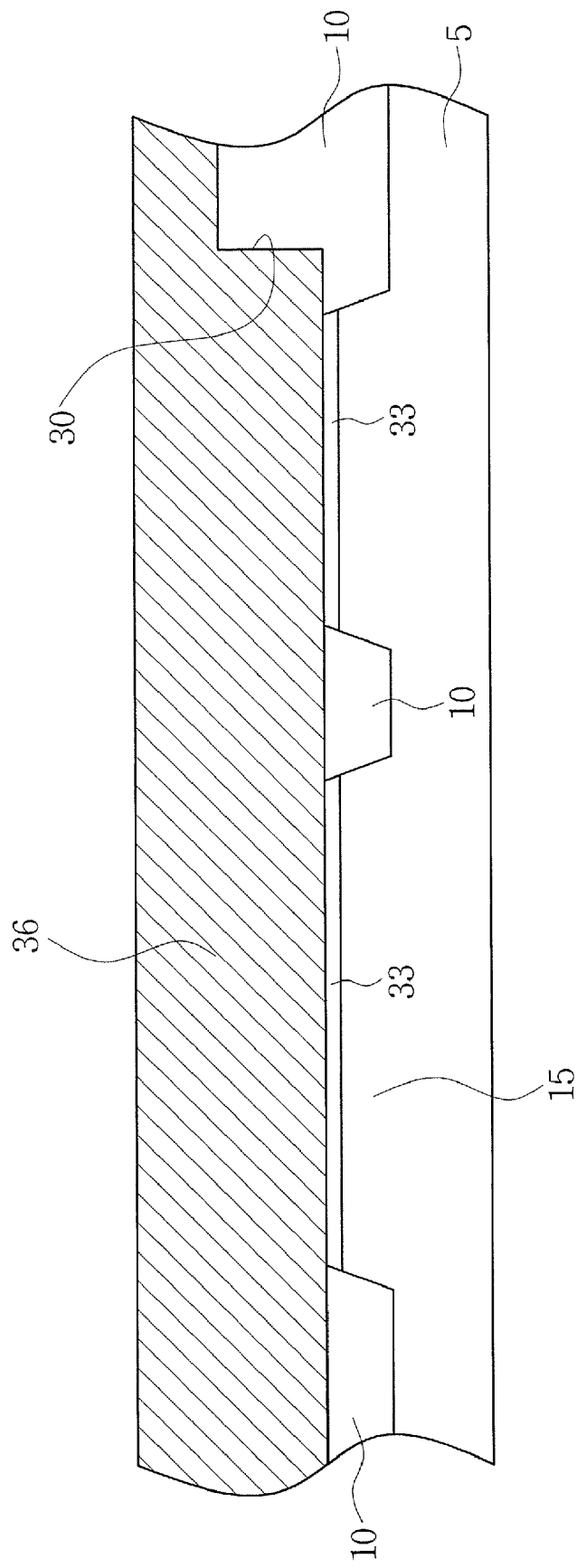
Figure 8:
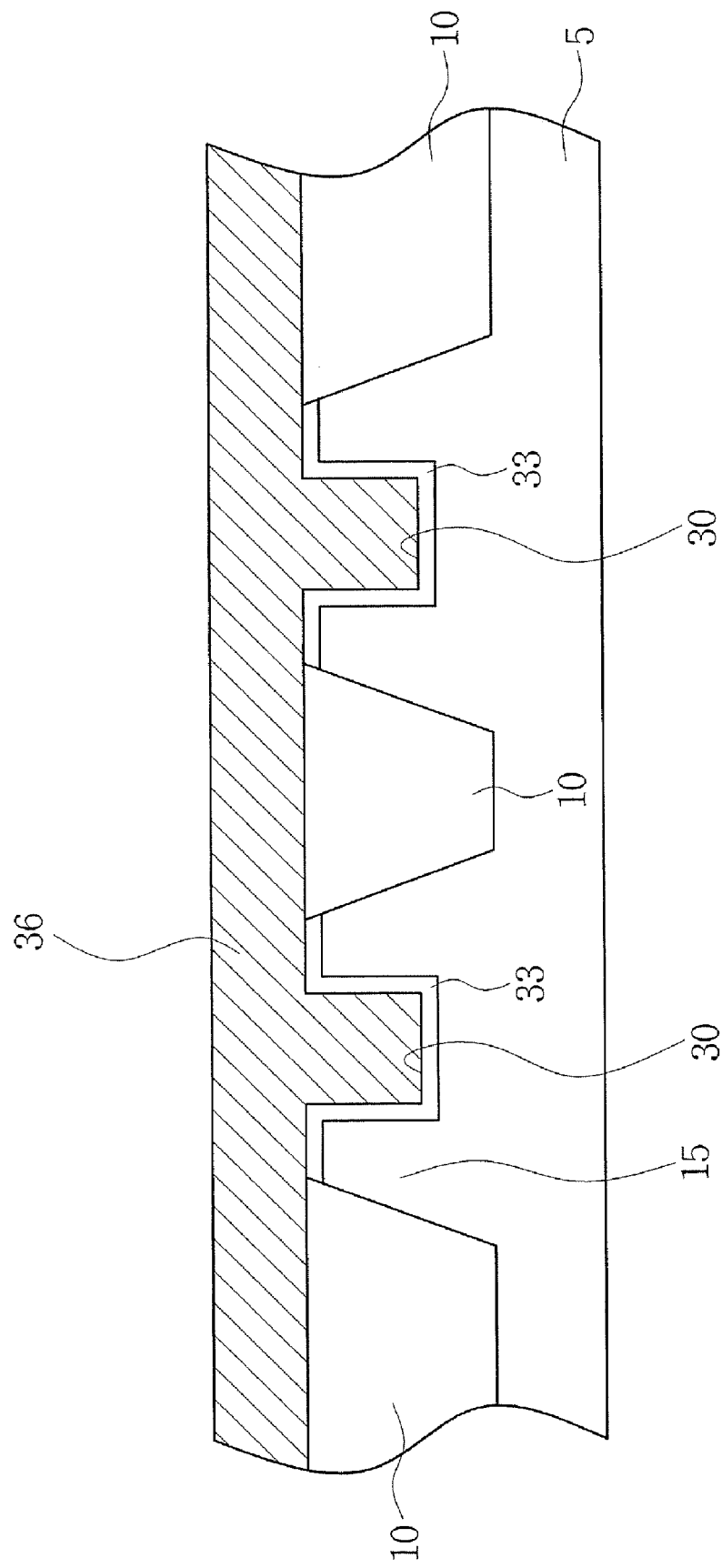

Referring to FIGS. 1, 7, and 8, where the sacrificial layer 25 is formed of silicon nitride, a photoresist layer is formed on the sacrificial layer 25. The photoresist layer may be formed by well-known semiconductor photolithography processes. The photoresist layer may be formed to have an opening exposing the sacrificial layer 25. The sacrificial layer 25, the buffer layer 20, the active region 15, and the isolation layer 10 are etched using the photoresist layer as an etch mask to form a channel trench 30 as shown in FIGS. 1, 7, and 8. The channel trench 30 is surrounded by the active region 15 and the isolation layer 10.

After the formation of the channel trench 30, the photoresist layer, the sacrificial layer 25, and the buffer layer 20 are sequentially removed from the active region 15 and the isolation layer 10. Alternatively, when the sacrificial layer 25 is formed of photoresist, the sacrificial layer 25 may be formed to have an opening exposing the buffer layer 20. The buffer layer 20, the active region 15, and the isolation layer 10 may be etched using the sacrificial layer 25 as an etch mask to form a channel trench 30 as shown in FIGS. 1, 7, and 8, and the sacrificial layer 25 and the buffer layer 20 may be sequentially removed from the active region 15 and the isolation layer 10.

A gate insulating layer 33 is formed in the active region 15 as shown in FIGS. 7 and 8. The gate insulating layer 33 may be silicon oxide. The gate insulating layer 33 may be formed of an insulating material having at least one of metal and non-metal atoms in a lattice of silicon oxide. A wire electrode layer 36 is formed on the active region 15 and the isolation layer 10 to fill the channel trench 30 as shown in FIGS. 7 and 8. The wire electrode layer 36 may be formed of a conductive material. For example, the wire electrode layer 36 may be formed of doped polysilicon, metal nitride, and/or a combination thereof.

Figure 11:
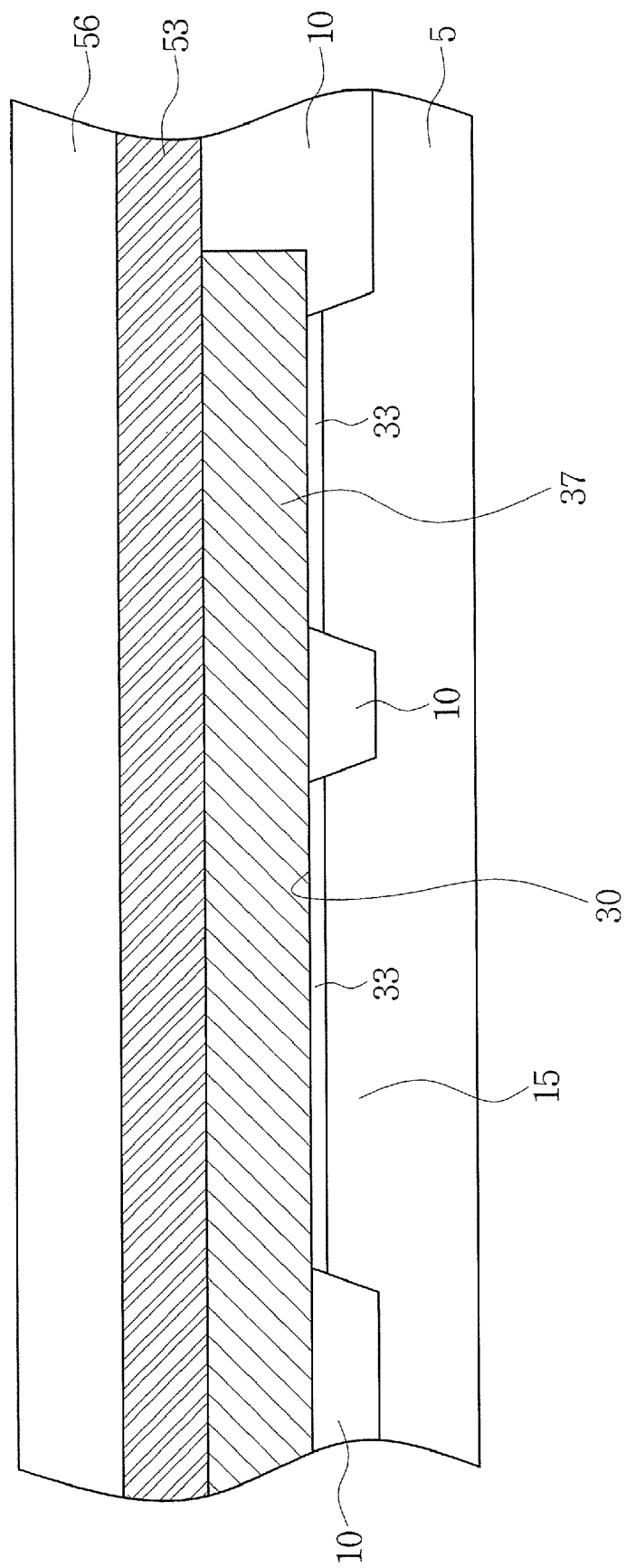
Figure 12:
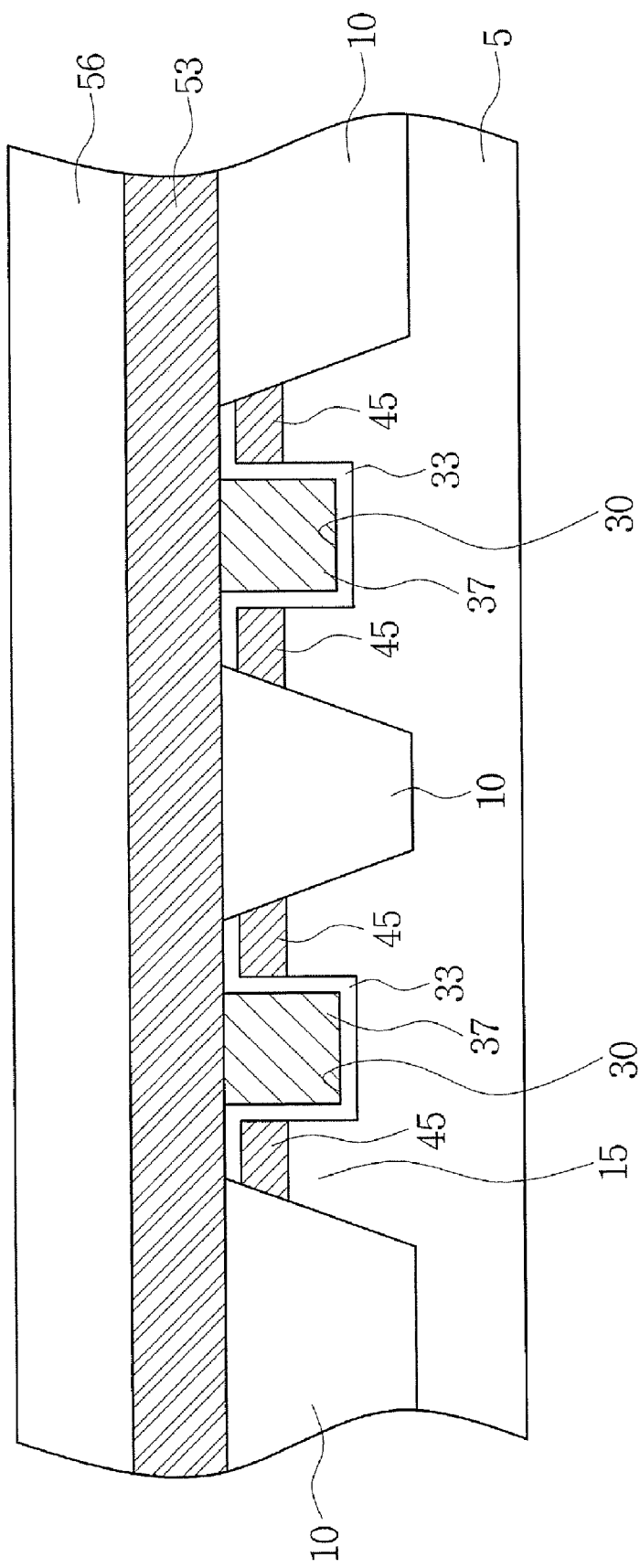

Referring to FIGS. 1, 11, and 12, a planarization technique is carried out on the wire electrode layer 36 until the gate insulating layer 33 and the isolation layer 10 are exposed. The planarization technique may be carried out using well-known etch back and/or chemical mechanical polishing processes. Accordingly, the semiconductor planarization technique may form a preliminary plug wire 37 in the channel trench 30 as shown in FIGS. 11 and 12. Subsequently, impurity ions are implanted into the active region 15 using the preliminary plug wire 37 and the isolation layer 10 as a mask to form impurity diffusion regions 45 as shown in FIGS. 11 and 12. The diffusion regions 45 may be formed to have a different conductivity from the semiconductor substrate 5.

A wire connection electrode layer 53 and a wire capping layer 56 are sequentially formed on the gate insulating layer 33 and the isolation layer 10 to cover the preliminary plug wire 37 as shown in FIGS. 11 and 12. The wire capping layer 56 may be an insulating material. The wire capping layer 56 may be formed of silicon oxide or silicon nitride. The wire connection electrode layer 53 may be a conductive material. The wire connection electrode layer 53 may be formed of doped polysilicon, metal nitride, or a combination thereof. In some embodiments, the wire connection electrode layer 53 and the preliminary plug wire 37 may be formed of different conductive materials from each other. In other embodiments, the wire connection electrode layer 53 and the preliminary plug wire 37 may be formed of the same conductive material.

Referring to FIGS. 1, 15, and 16, a photoresist pattern is formed on the wire capping layer 56. The photoresist pattern may be formed by a well-known semiconductor photolithography technique. The photoresist pattern may be formed on one end of the preliminary plug wire 37 to overlap and/or cover portions of the preliminary plug wire 37 and the isolation layer 10. The wire capping layer 56, the wire connection electrode layer 53, and the preliminary plug wire 37 are sequentially etched using the photoresist pattern as an etch mask to form a plug wire pattern 38, a wire connection electrode 54, and a wire capping pattern 57 as shown in FIGS. 15 and 16. In this case, the wire connection electrode 54 may be formed to directly contact the plug wire pattern 38. The plug wire pattern 38 functions as the gate electrode of the transistor 84 of FIG. 1.

The wire capping pattern 57 and the wire connection electrode 54 are formed to overlap and/or cover portions of the channel trench 30. Accordingly, the wire capping pattern 57 and the wire connection electrode 54 may expose portions of the plug wire pattern 38. The plug wire pattern 38 is formed in the channel trench 30. The plug wire pattern 38 may expose portions of the gate insulating layer on sidewalls of the channel trench 30. Specifically, the plug wire pattern 38 may be formed to have a recessed portion and a protruding plug portion having first and second top surfaces S1 and S2, respectively, at different levels from each other as shown in FIGS. 15 and 16. The first top surface S1 of the recessed portion of the plug wire pattern 38 may be formed at a lower level than the top surface of the active region 15 outside the channel trench 30. The second top surface S2 of the plug portion of the plug wire pattern 38 may be formed at substantially the same level as the top surface of the active region 15 outside the channel trench 30.

In addition, the wire connection electrode 54 and the wire capping pattern 57 are sequentially formed on the second top surface S2 of the plug portion of the plug wire pattern 38. The wire connection electrode 54 may be a circuit wire pattern of the core region A which supplies power to the plug wire pattern 38. In this case, the wire connection electrode 54 and the wire capping pattern 57 may overlap and/or cover portions of the active region 15. The wire connection electrode 54 and the wire capping pattern 57 may be spaced apart from the active region 15. The wire connection electrode 54 and the wire capping pattern 57 along with the plug wire pattern 38 form a wire pattern 64 as shown in FIGS. 1, 15, and 16. The wire pattern 64 may have a predetermined length and may extend in both the core region A and the cell array region B.

Referring back to FIGS. 1, 15, and 16, the photoresist pattern is removed from the active region 15 and the isolation layer 10. A wire spacer layer (not shown) is formed on the plug wire pattern 38 to cover the wire capping pattern 57 and the wire connection electrode 54. The wire spacer layer may be an insulating material having a different etch rate from the isolation layer 10. The wire spacer layer may be formed of silicon oxide or silicon nitride.

The wire spacer layer is blanket-etched to expose portions of the active region 15 and the isolation layer 10 so that a plug spacer 73 is formed. The plug spacer 73 is formed on the plug wire pattern 38 and covers sidewalls of the wire capping pattern 57 and the wire connection electrode 54. The top surface of the plug spacer 73 may be formed at substantially the same level as the top surface of the active region 15 outside the trench 30 and/or the isolation layer 10. A passivation layer 76 is formed on the plug spacer 73 and the wire pattern 64 as shown in FIGS. 15 and 16. The passivation layer 76 may be an insulating material. The passivation layer 76 may be formed of silicon oxide. The passivation layer 76 may also be formed of insulating material having at least one of metal and non-metal atoms in a lattice of silicon oxide.

Contact holes 79 may be formed as shown in FIG. 1. The contact holes 79 are formed on predetermined regions of the top surface of the passivation layer 76 and sequentially penetrate the passivation layer 76 and the gate insulating layer 33. The contact holes 79 may expose the active region 15. Electrical nodes (not shown) may be formed to fill the contact holes 79, respectively. The electrical nodes may be formed of a conductive material. Accordingly, the electrical nodes along with the wire pattern 64, the diffusion regions 45 and the plug wire pattern 38 form the transistor 84 as shown in FIGS. 1, 15, and 16.

Methods of fabricating integrated circuit wire patterns in accordance with some embodiments of the present invention will now be described with reference to FIGS. 2, 5, 6, 9, 10, 13, 14, 17, and 18.

FIGS. 5, 6, 9, 10, 13, 14, 17, and 18 are cross-sectional views illustrating methods of fabricating integrated circuit wire patterns taken along lines I-I' and II-II' of FIG. 2, respectively, in accordance with some embodiments of the present invention.

Figure 5:
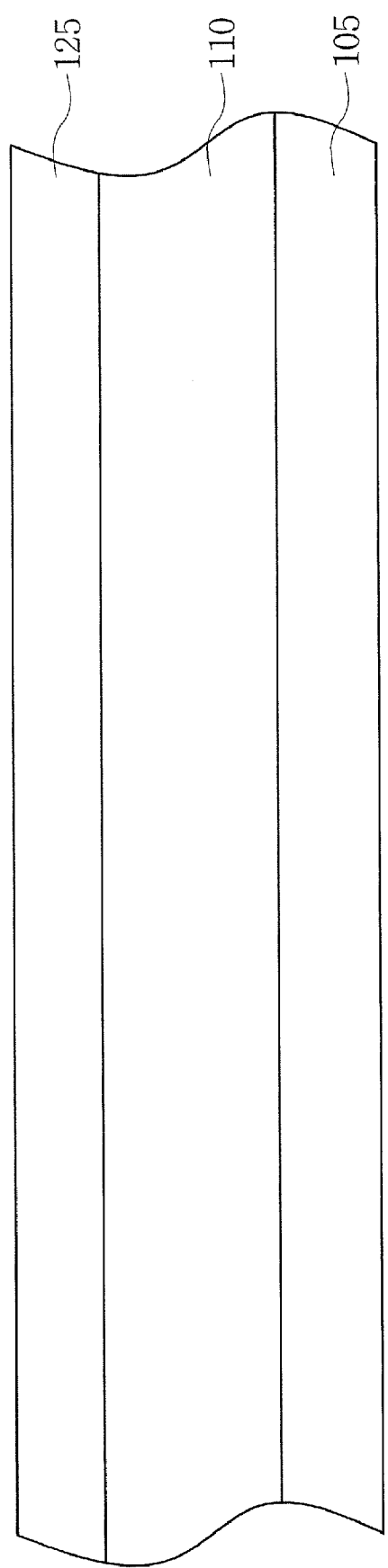
FIGS. 5, 6, 9, 10, 13, 14, 17, and 18 are cross-sectional views illustrating methods of forming integrated circuit wiring taken along lines I-I' and II-II' of FIG. 2 in accordance with some embodiments of the present invention.
Figure 6:
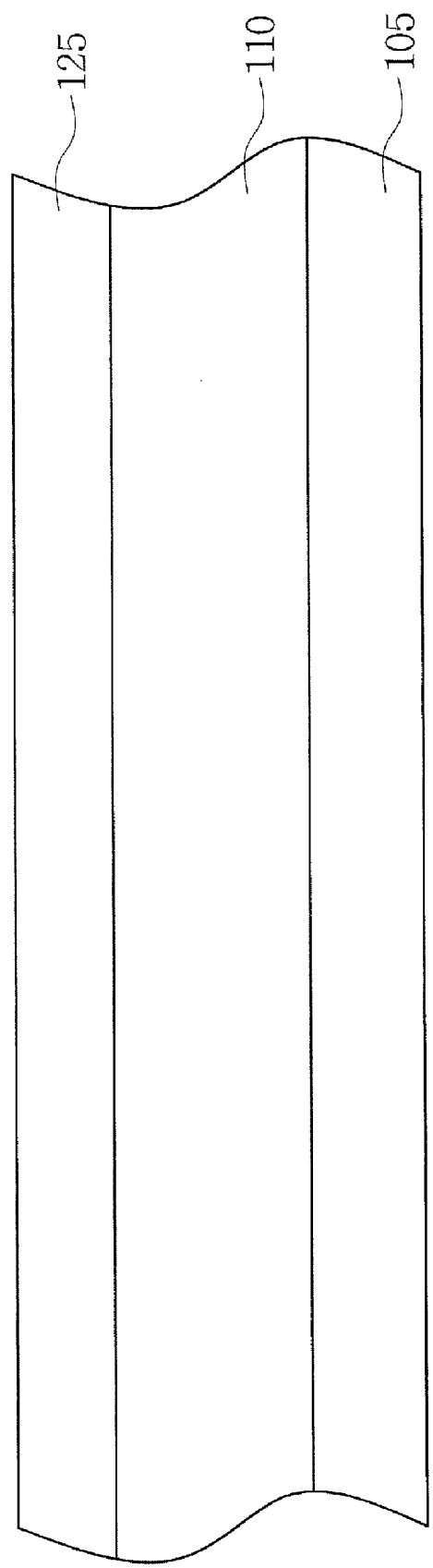

Referring to FIGS. 2, 5, and 6, a semiconductor substrate 105 having a selected region C is provided as shown in FIGS. 5 and 6. The semiconductor substrate 105 is formed to have an N- or P-type conductivity. The selected region C may be a cell array region or a peripheral circuit region. A molding layer 110 and a sacrificial layer 125 are sequentially formed on the semiconductor substrate 105 as shown in FIGS. 5 and 6. The sacrificial layer 125 and the molding layer 110 may be insulating materials having different etch rates from each other. For example, the sacrificial layer 125 and the molding layer 110 may be formed of silicon nitride and silicon oxide, respectively. In other embodiments, the sacrificial layer 125 and the molding layer 110 may be formed of polysilicon and silicon oxide, respectively. In still other embodiments, the sacrificial layer 125 and the molding layer 110 may be formed of photoresist and silicon oxide, respectively.

Figure 9:
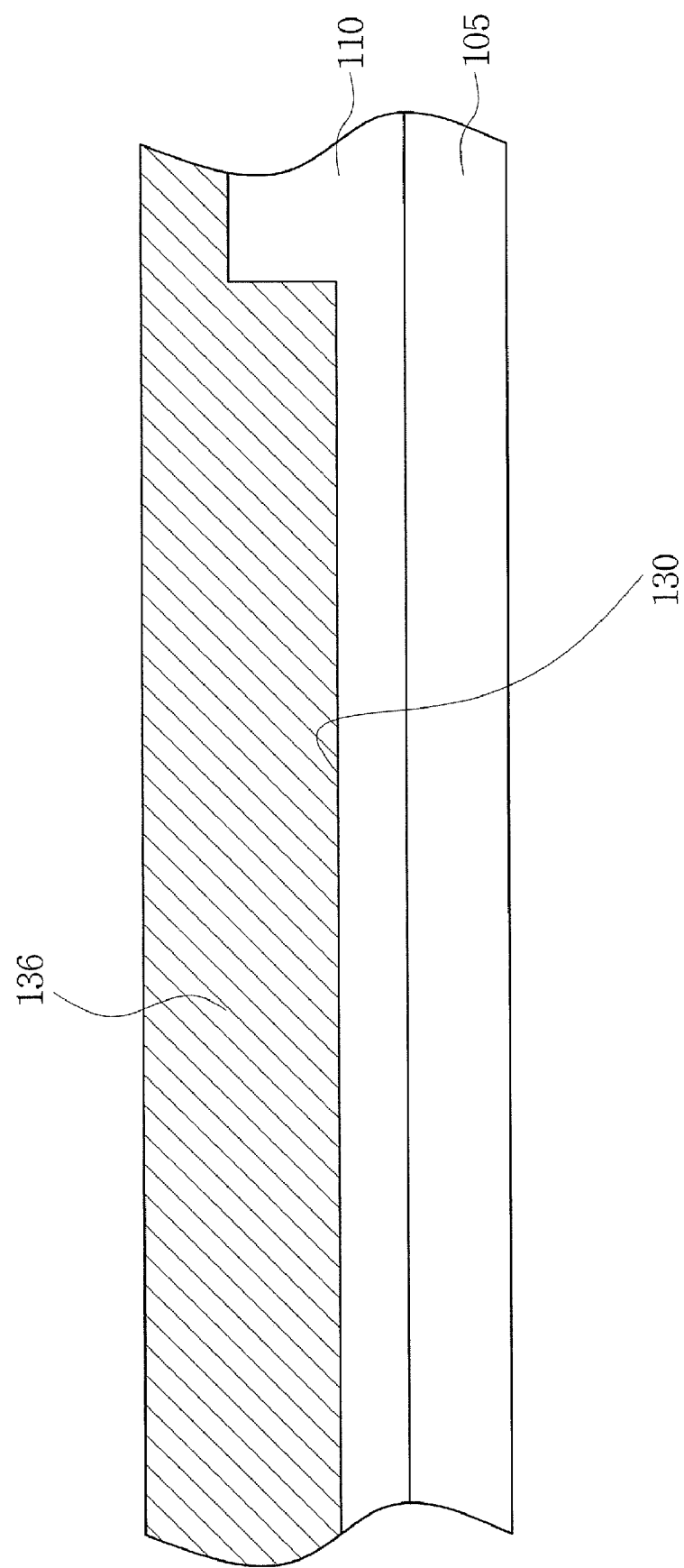
Figure 10:
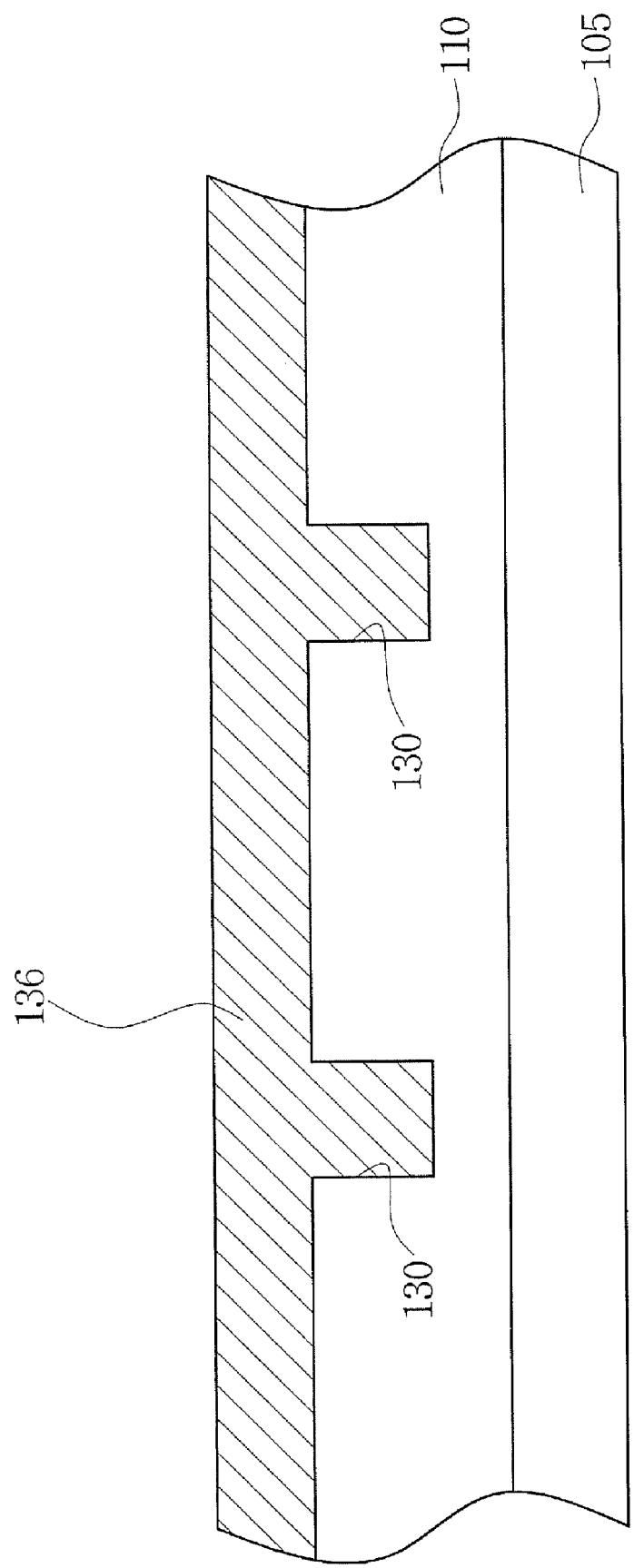

Referring to FIGS. 2, 9, and 10, where the sacrificial layer 125 is formed of silicon nitride or polysilicon, a photoresist layer is formed on the sacrificial layer 125. The photoresist layer may be formed by a well-known semiconductor photolithography technique. The photoresist layer may be formed to have an opening exposing the sacrificial layer 125. The sacrificial layer 125 and the molding layer 110 are etched using the photoresist layer as an etch mask to form a molding trench 130 as shown in FIGS. 2, 9, and 10. The molding trench 130 is partially surrounded by sidewalls of the molding layer 110. After the formation of the molding trench 130, the photoresist layer and the sacrificial layer 125 are sequentially removed from the molding layer 110.

Alternatively, where the sacrificial layer 125 is formed of photoresist, the sacrificial layer 125 may be formed to have an opening exposing the molding layer 110. The molding layer 110 may be etched using the sacrificial layer 125 as an etch mask to form a molding trench 130 as shown in FIGS. 2, 9, and 10, and the sacrificial layer 125 may be removed from the molding layer 110. A wire electrode layer 136 is formed on the molding layer 110 to fill the molding trench 130 as shown in FIGS. 9 and 10. The wire electrode layer 136 may be a conductive material. For example, the wire electrode layer 136 may be formed of doped polysilicon, metal nitride, and/or a combination thereof.

Figure 13:
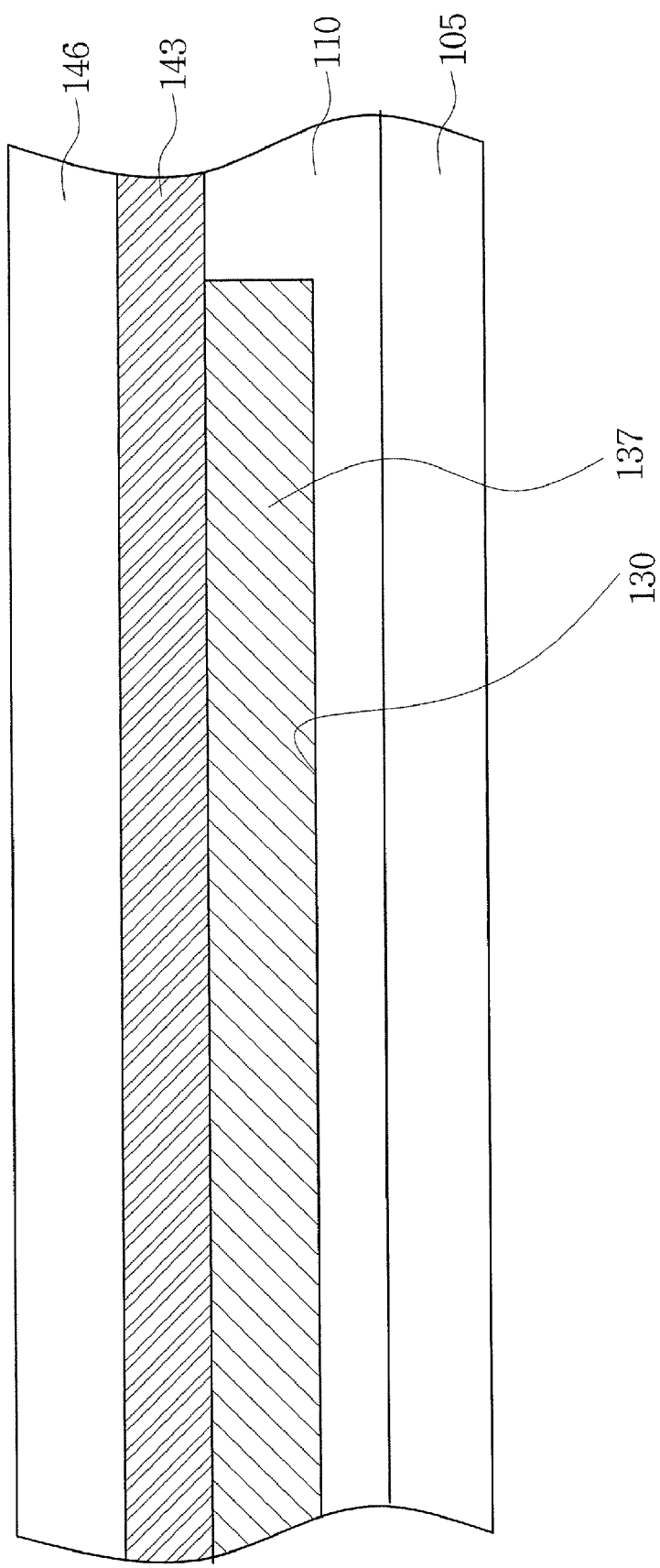
Figure 14:
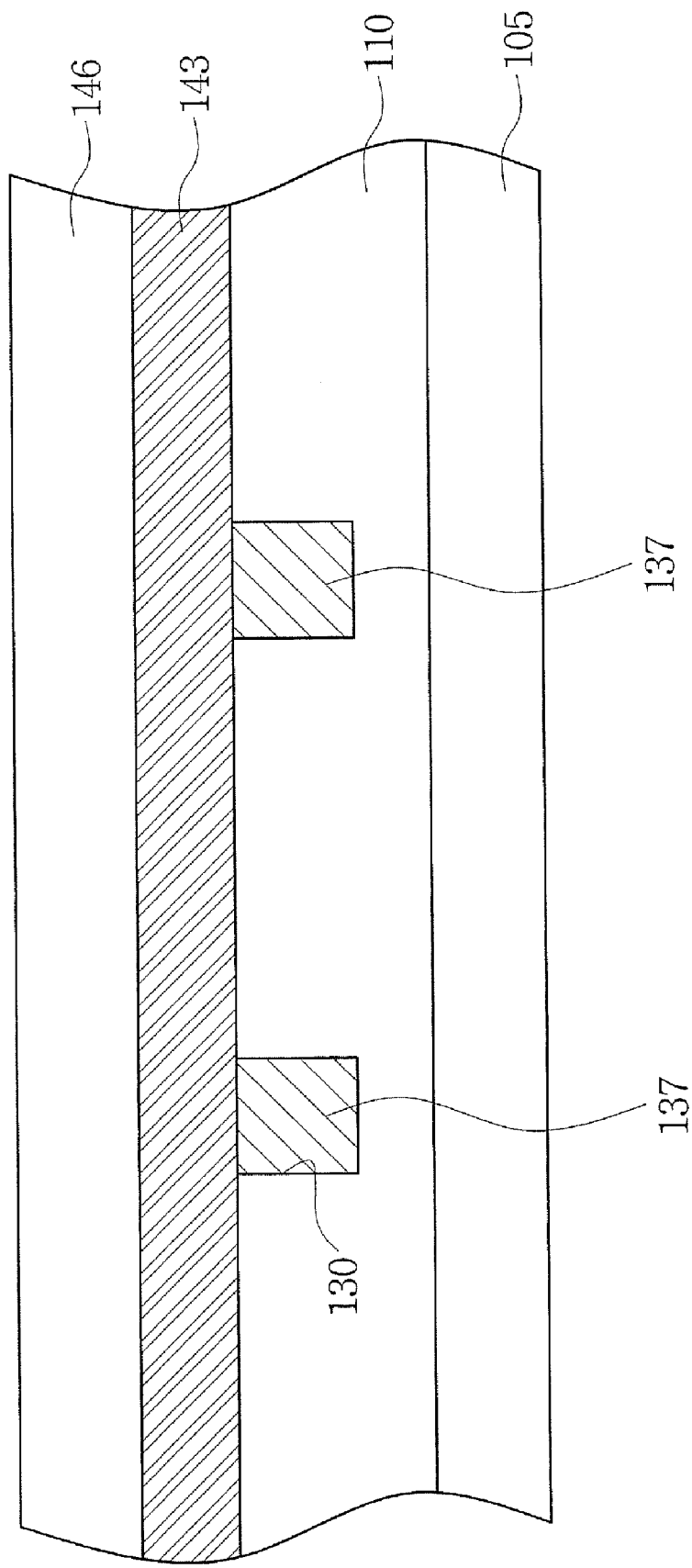

Referring to FIGS. 2, 13, and 14, a planarization technique is carried out on the wire electrode layer 136 until the molding layer 110 is exposed. The planarization technique may be carried out using well-known etch back and/or chemical mechanical polishing processes. Accordingly, the semiconductor planarization technique may form a preliminary plug wire 137 in the molding trench 130 as shown in FIGS. 13 and 14. A wire connection electrode layer 143 and a wire capping layer 146 are sequentially formed on the molding layer 110 to cover the preliminary plug wire 137 as shown in FIGS. 13 and 14.

The wire capping layer 146 may be an insulating material. The wire capping layer 146 may be formed of silicon oxide or silicon nitride. The wire connection electrode layer 143 may be a conductive material. The wire connection electrode layer 143 may be formed of doped polysilicon, metal nitride, and/or a combination thereof. In some embodiments, the wire connection electrode layer 143 and the preliminary plug wire 137 may be formed of different conductive materials from each other. In other embodiments, the wire connection electrode layer 143 and the preliminary plug wire 137 may be formed of the same conductive material.

Referring to FIGS. 2, 17, and 18, a photoresist pattern is formed on the wire capping layer 146. The photoresist pattern may be formed by well-known semiconductor photolithography techniques. The photoresist pattern may be disposed on one end of the preliminary plug wire 137 to overlap and/or cover portions of the preliminary plug wire 137 and the molding layer 110. The wire capping layer 146, the wire connection electrode layer 143, and the preliminary plug wire 137 are sequentially etched using the photoresist pattern as an etch mask to form a plug wire pattern 138, a wire connection electrode 144, and a wire capping pattern 147. The wire connection electrode 144 may be formed to directly contact the plug wire pattern 138.

The wire capping pattern 147 and the wire connection electrode 144 overlap and/or cover portions of the molding trench 130. Accordingly, the wire capping pattern 147 and the wire connection electrode 144 may expose portions of the plug wire pattern 138. The plug wire pattern 138 is formed in the molding trench 130. Portions of the plug wire pattern 138 may expose sidewalls of the molding trench 130. More specifically, the plug wire pattern 138 may include a recessed portion and a plug portion having first and second top surfaces S3 and S4, respectively, at different levels from each other as shown in FIGS. 17 and 18. The first top surface S3 of the recessed portion of the plug wire pattern 138 may be formed at a lower level than the top surface of the molding layer 110 outside the trench 130. The second top surface S4 of the plug portion of the plug wire pattern 138 may be formed at substantially the same level as the top surface of the molding layer 110 outside the trench 130.

In addition, the wire connection electrode 144 and the wire capping pattern 147 are sequentially formed on the second top surface S4 of the plug portion of the plug wire pattern 138. The wire connection electrode 144 is a peripheral circuit wire pattern which supplies power to the plug wire pattern 138. The wire connection electrode 144 and the wire capping pattern 147 may overlap and/or cover portions of the molding trench 130. The wire connection electrode 144 and the wire capping pattern 147 along with the plug wire pattern 138 form a wire pattern 154 as shown in FIGS. 2, 17, and 18. The wire pattern 154 may have a predetermined length, and may be formed in the selected region C.

Referring back to FIGS. 2, 17, and 18, the photoresist pattern is removed from the molding layer 110. A wire spacer layer (not shown) is formed on the plug wire pattern 138 to cover the wire capping pattern 147 and the wire connection electrode 144. The wire spacer layer may be an insulating material having a different etch rate from the molding layer 110. For example, the wire spacer layer may be formed of silicon oxide or silicon nitride.

The wire spacer layer is blanket-etched to expose the molding layer 110 so that a plug spacer 163 is formed. The plug spacer 163 is formed on the plug wire pattern 138 and covers sidewalls of the wire capping pattern 147 and the wire connection electrode 144. The top surface of the plug spacer 163 may be formed at substantially the same level as the top surface of the molding layer 110 outside the trench 130. A passivation layer 166 is formed on the plug spacer 163 and the wire pattern 154 as shown in FIGS. 17 and 18. The passivation layer 166 may be an insulating material. For example, the passivation layer 166 may be formed of silicon oxide. The passivation layer 166 may also be formed of an insulating material having at least one of metal and non-metal atoms in a lattice of silicon oxide. Accordingly, the wire pattern 154 along with the plug wire pattern 138 forms an integrated circuit wire pattern 174 as shown in FIGS. 2, 17, and 18.

Methods of fabricating transistors in accordance with other embodiments of the present invention will now be described with reference to FIGS. 1, 19, 20, 23, and 24.

FIGS. 19, 20, 23, and 24 are cross-sectional views illustrating methods of fabricating transistors taken along lines I-I' and II-II' of FIG. 1 in accordance with other embodiments of the present invention. Like reference numerals may refer to the same materials used in previous embodiments discussed above.

Figure 19:
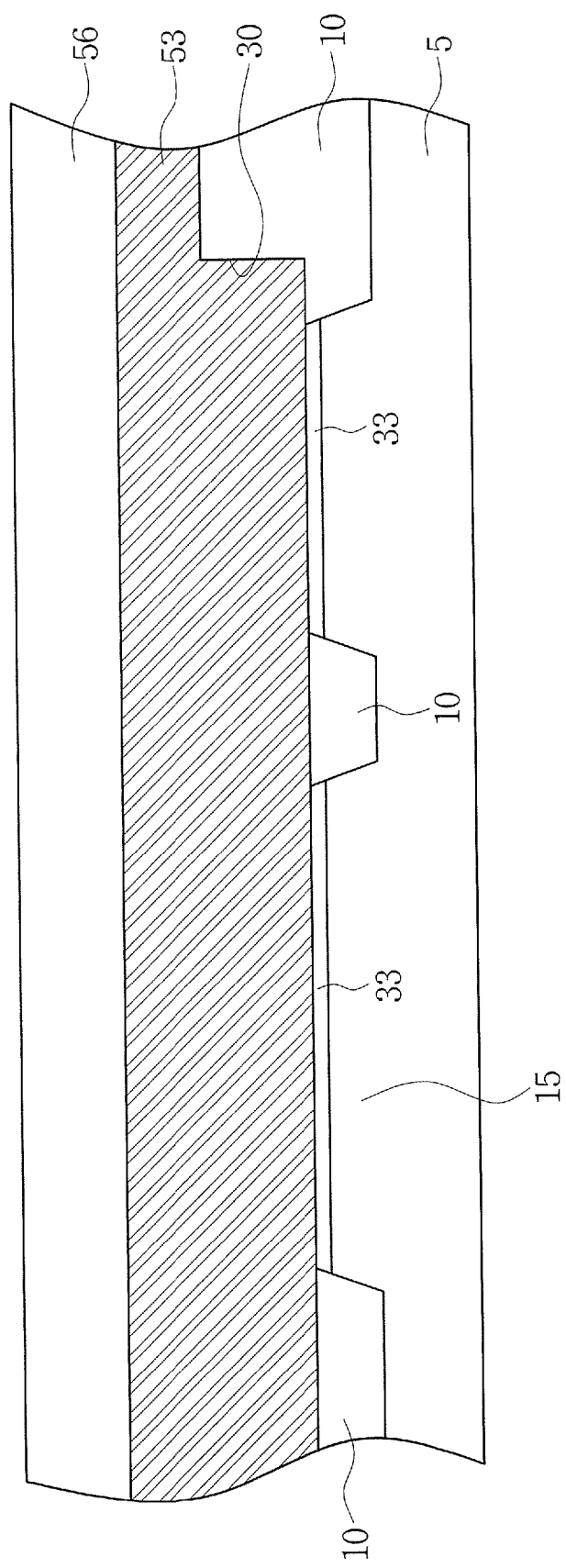
FIGS. 19, 20, 23, and 24 are cross-sectional views illustrating methods of forming a transistor taken along lines I-I' and II-II' of FIG. 1 in accordance with further embodiments of the present invention.
Figure 20:
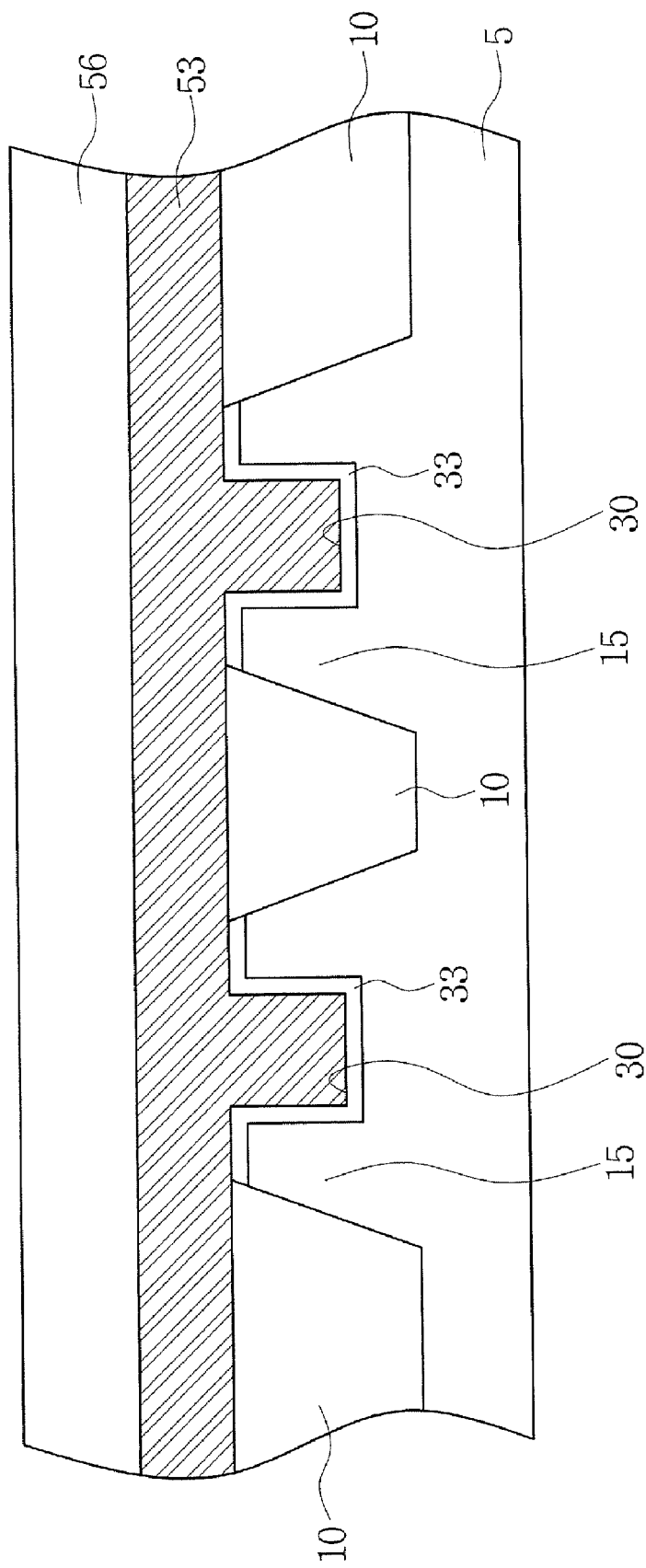

Referring to FIGS. 1, 19, and 20, after a channel trench 30 is formed in an active region 15 and an isolation layer 10 as shown in FIG. 1, 7, or 8, a gate insulating layer 33 is formed in the active region 15 as shown in FIGS. 19 and 20. A wire connection electrode layer 53 and a wire capping layer 56 are sequentially formed on the active region 15 and the isolation layer 10 as shown in FIGS. 19 and 20. The wire connection electrode layer 53 may fill the channel trench 30.

Referring to FIGS. 1, 23, and 24, a photoresist pattern is formed on the wire capping layer 56. The photoresist pattern may be formed by well-known semiconductor photolithography techniques. The photoresist pattern may be formed on one end of the channel trench 30 to overlap and/or cover portions of the channel trench 30 and the isolation layer 10. The wire capping layer 56 and the wire connection electrode layer 53 are sequentially etched using the photoresist pattern as an etch mask to form a plug wire pattern 39, a wire connection electrode 55, and a wire capping pattern 57 as shown in FIGS. 23 and 24. The wire connection electrode 55 and the plug wire pattern 39 are formed of the same material. The plug wire pattern 39 functions as the gate electrode of the transistor 88 of FIG. 1.

The wire connection electrode 55 and the wire capping pattern 57 may be defined to extend on the channel trench 30 and to overlap and/or cover portions of the channel trench 30. Accordingly, the wire connection electrode 55 and the wire capping pattern 57 may expose portions of the plug wire pattern 39. In addition, the plug wire pattern 39 may be defined in the channel trench 30 to expose portions of the gate insulating layer 33 on a sidewall of the channel trench 30. More specifically, the plug wire pattern 39 may include a recessed portion and a protruding plug portion having first and second top surfaces S1 and S2, respectively, at different levels from each other, as shown in FIGS. 23 and 24. The first top surface S1 of the recessed portion of the plug wire pattern 39 may be formed at a lower level than the top surface of the active region 15 outside the trench 30. The second top surface S2 of the plug portion of the plug wire pattern 39 may be formed at substantially the same level as the top surface of the active region 15 outside the trench 30.

In addition, the wire connection electrode 55 and the wire capping pattern 57 are sequentially formed on the second top surface S2 of the plug portion of the plug wire pattern 39. The wire connection electrode 55 is a circuit wire pattern of the core region A which supplies power to the plug wire patterns 39. The wire connection electrode 55 and the wire capping pattern 57 may overlap and/or cover portions of the active region 15. The wire connection electrode 55 and the wire capping pattern 57 may also be spaced apart from the active region 15. The wire connection electrode 55 and the wire capping pattern 57 along with the plug wire pattern 39 form a wire pattern 68 as shown in FIGS. 1, 23, and 24. The wire pattern 68 may have a predetermined length, and may be formed in both the core region A and the cell array region B.

Referring back to FIGS. 1, 23, and 24, the photoresist pattern is removed from the active region 15 and the isolation layer 10. A wire spacer layer (not shown) is formed on the plug wire pattern 39 to cover the wire capping pattern 57 and the wire connection electrode 55. The wire spacer layer is blanket-etched to expose the active region 15 and the isolation layer 10 so that a plug spacer 73 is formed. The plug spacer 73 is formed on the plug wire pattern 39 and covers sidewalls of the wire capping pattern 57 and the wire connection electrode 55. The top surface of the plug spacer 73 may be formed to be disposed at substantially the same level as the top surface of the active region 15 or the isolation layer 10.

A passivation layer 76 is formed on the plug spacer 73 and the wire pattern 68 as shown in FIGS. 23 and 24. Contact holes 79 may be formed as shown in FIG. 1. The contact holes 79 are formed in predetermined regions of the top surface of the passivation layer 76 and sequentially penetrate the passivation layer 76 and the gate insulating layer 33. The contact holes 79 may expose the active region 15. Electrical nodes (not shown) may be formed to fill the contact holes 79, respectively. The electrical nodes may be formed of a conductive material. Accordingly, the electrical nodes along with the wire pattern 68, the diffusion regions 45 and the plug wire pattern 39 form the transistor 88 as shown in FIGS. 1, 23, and 24.

Methods of fabricating integrated circuit wire patterns in accordance with other embodiments of the present invention will now be described with reference to FIGS. 2, 21, 22, 25, and 26.

FIGS. 21, 22, 25, and 26 are cross-sectional views illustrating methods of fabricating integrated circuit wire patterns taken along lines I-I' and II-II' of FIG. 2 in accordance with other embodiments of the present invention. Like reference numerals may refer to the same materials used in previous embodiments discussed above.

Figure 21:
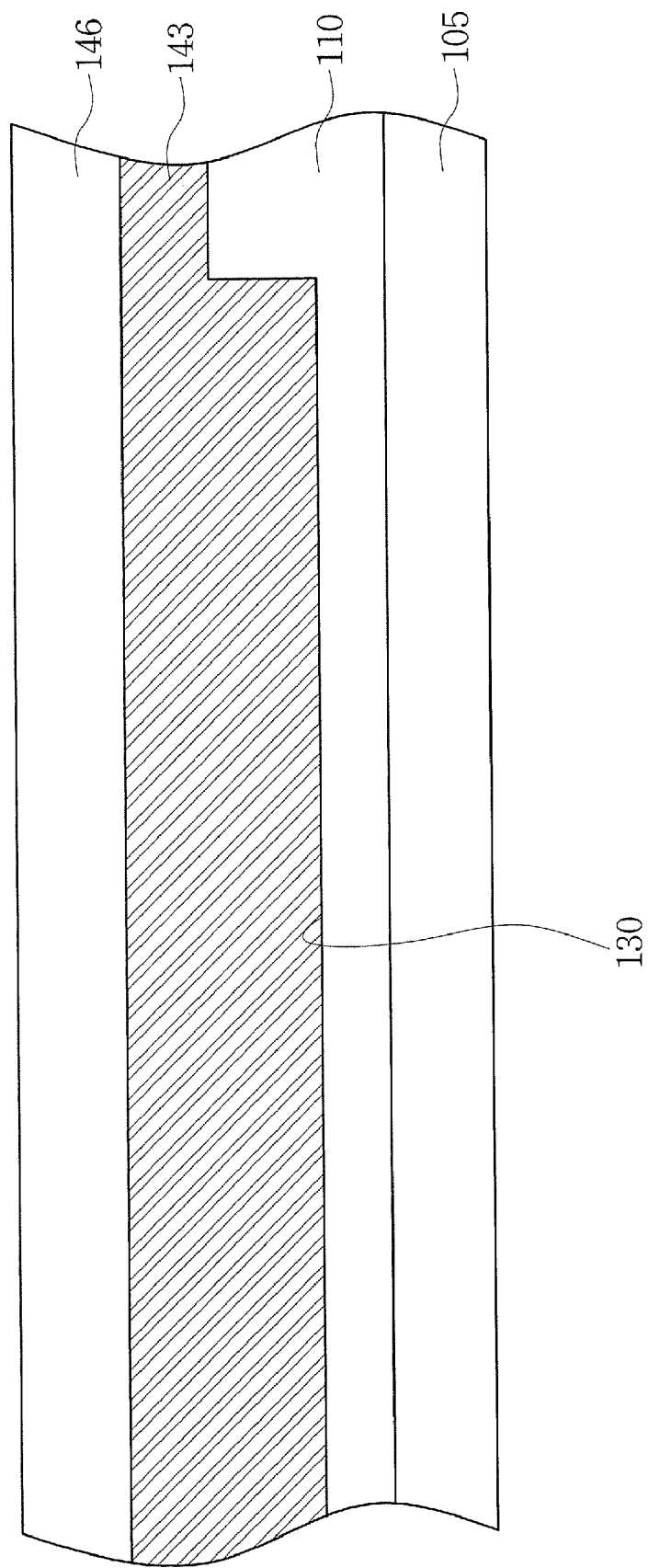
FIGS. 21, 22, 25, and 26 are cross-sectional views illustrating methods of forming integrated circuit wiring taken along lines I-I' and II-II' of FIG. 2 in accordance with further embodiments of the present invention.
Figure 22:
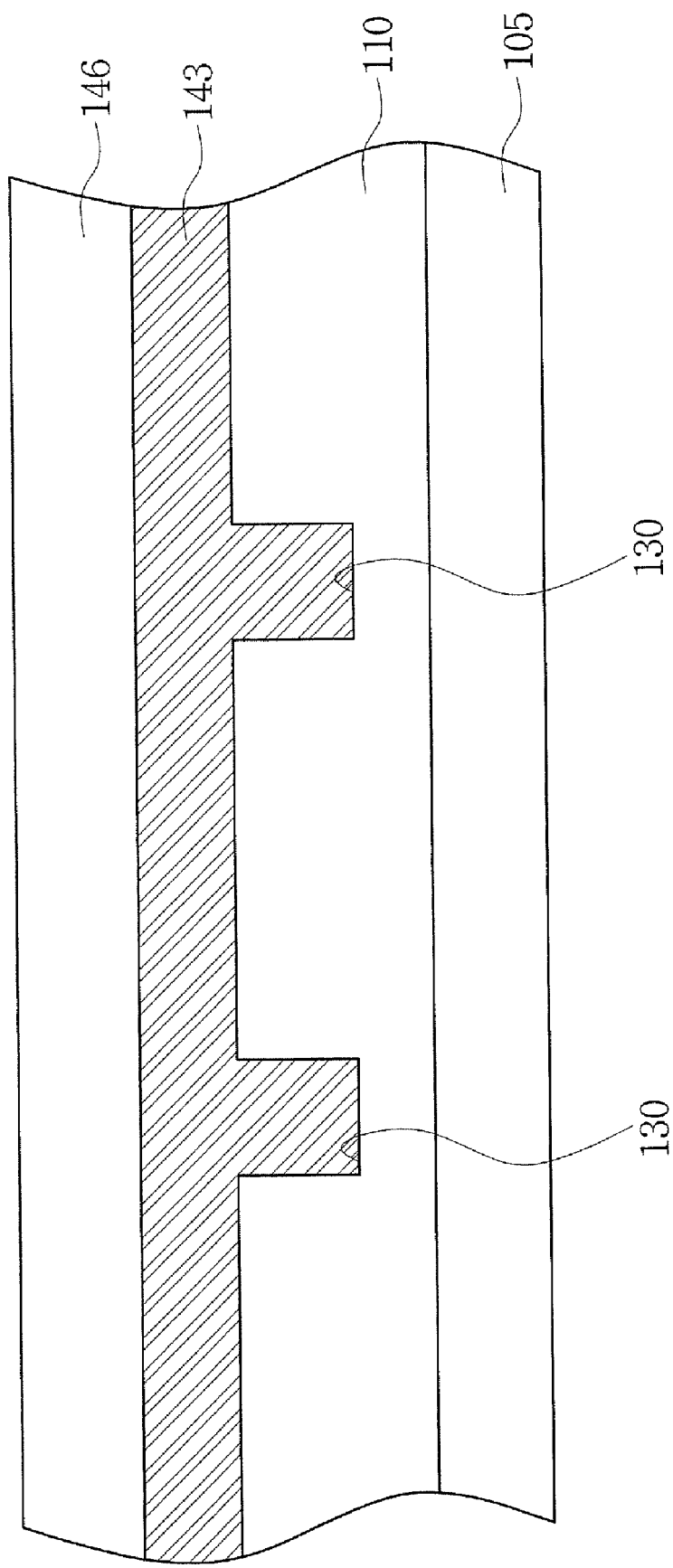

Referring to FIGS. 2, 21, and 22, after a molding trench 130 is formed in a selected region C of a semiconductor substrate 5 as shown in FIG. 1, 9, or 10, a wire connection electrode layer 143 and a wire capping layer 146 are sequentially formed on the molding layer 110 as shown in FIGS. 21 and 22. The wire connection electrode layer 143 may be formed to fill the molding trench 130.

Referring to FIGS. 2, 25, and 26, a photoresist pattern is formed on the wire capping layer 146. The photoresist pattern may be formed using well-known semiconductor photolithography techniques. In this case, the photoresist pattern may be formed on one end of the molding trench 130 to overlap and/or cover portions of both the molding trench 130 and the molding layer 110. The wire capping layer 146 and the wire connection electrode layer 143 are sequentially etched using the photoresist pattern as an etch mask to form a plug wire pattern 139, a wire connection electrode 145, and a wire capping pattern 147 as shown in FIGS. 2, 25, and 26. The wire connection electrode 145 and the plug wire pattern 139 are formed of the same material.

The wire connection electrode 145 and the wire capping pattern 147 may be formed on the molding trench 130 and may overlap and/or cover portions of the molding trench 130. Accordingly, the wire connection electrode 145 and the wire capping pattern 147 may expose portions of the plug wire pattern 139. In addition, the plug wire pattern 139 may be defined in the molding trench 130 to expose sidewalls of the molding trench 130. More specifically, the plug wire pattern 139 may include a recessed portion and a protruding plug portion having first and second top surfaces S3 and S4, respectively, at different levels from each other, as shown in FIGS. 25 and 26. The first top surface S3 of the recessed portion of the plug wire pattern 139 may be formed at a lower level than the top surface of the molding layer 110 outside the trench 130. The second top surface S4 of the plug portion of the plug wire pattern 139 may be formed substantially at the same level as the top surface of the molding layer 110 outside the trench 130.

In addition, the wire connection electrode 145 and the wire capping pattern 147 are sequentially formed on the second top surface S2 of the plug portion of the plug wire pattern 139. The wire connection electrode 145 is a peripheral circuit wire pattern which supplies power to the plug wire pattern 139. The wire connection electrode 145 and the wire capping pattern 147 may overlap and/or cover portions of the molding layer 110 on opposite sides of the molding trench 130. The wire connection electrode 145 and the wire capping pattern 147 along with the plug wire pattern 139 form a wire pattern 158 as shown in FIGS. 2, 25, and 26. The wire pattern 158 may be formed to have a predetermined length, and may be formed in the selected region C.

Referring back to FIGS. 2, 25, and 26, the photoresist pattern is removed from the molding layer 110. A wire spacer layer (not shown) is formed on the plug wire pattern 139 to cover the wire capping pattern 147 and the wire connection electrode 145. The wire spacer layer is blanket-etched to expose the molding layer 110 so that a plug spacer 163 is formed. The plug spacer 163 is formed on the plug wire pattern 139 and sequentially covers sidewalls of the wire capping pattern 147 and the wire connection electrode 145. The top surface of the plug spacer 163 may be formed at substantially the same level as the top surface of the molding layer 110. A passivation layer 166 is formed on the plug spacer 163 and the wire pattern 158 as shown in FIGS. 25 and 26. Accordingly, the wire pattern 158 along with the plug wire pattern 139 forms the integrated circuit wire patterns 178 as shown in FIGS. 2, 25, and 26.

As described above, some embodiments of the present invention provide integrated circuit wire patterns and methods of fabricating the same.

Accordingly, embodiments of the present invention can be employed in semiconductor devices with a relatively simple structure, and may simplify semiconductor manufacturing processes associated with the semiconductor devices.

While the present invention has been particularly shown and described with reference to preferred embodiments thereof, it will be understood by those skilled in the art that various changes in form and details may be made therein without departing from the spirit and scope of the invention as defined by the appended claims.

That which is claimed:

1. An integrated circuit device, comprising:
   a substrate including a trench in active regions and a device isolation layer of the substrate, wherein the active regions are defined by the device isolation layer, and wherein the trench has a same depth in the active regions and the device isolation layer; and
   a conductive plug wire pattern in the trench including a recessed portion that exposes portions of opposing sidewalls of the trench and an integral plug portion that protrudes from a surface of the recessed portion to provide an electrical connection to at least one other conductive wire pattern on a different level of metallization, wherein the recessed portion is in contact with a first sidewall of the plug portion on one of the active regions along a direction of the trench, wherein a second sidewall of the plug portion opposite the first sidewall and a bottom surface of the plug portion contact a portion of the device isolation layer adjacent to the one of the active regions along the direction, and wherein a top surface of the plug portion is at a substantially same level as top surfaces of the active regions.

2. The device of claim 1, wherein the surface of the recessed portion is below a surface of the substrate adjacent to and outside the trench.

3. The device of claim 2, wherein the surface of the substrate adjacent to and outside the trench comprises a major surface of the substrate.

4. The device of claim 1, further comprising:
   an insulating plug spacer layer in the trench on the surface of the recessed portion of the conductive plug wire pattern and on the first sidewall of the plug portion,
   wherein the plug spacer layer substantially covers the portions of the opposing sidewalls of the trench exposed by the recessed portion of the plug wire pattern and exposes the top surface of the plug portion to provide the electrical connection to the at least one other conductive wire pattern.

5. The device of claim 4, wherein the plug spacer layer fills the trench such that a surface thereof is at a substantially same level as surfaces of the substrate outside the trench on opposite sides thereof when viewed in a cross section perpendicular to the direction of the trench.

6. The device of claim 4, wherein the plug spacer layer comprises a different material than the substrate.

7. The device of claim 4, wherein the plug spacer layer further extends on a sidewall of the at least one other conductive wire pattern.

8. The device of claim 1, further comprising:
   a conductive circuit wire pattern directly on the plug portion of the plug wire pattern.
   wherein the conductive circuit wire pattern exposes the recessed portion of the plug wire pattern.

9. The device of claim 8, wherein the circuit wire pattern extends from the plug portion of the plug wire pattern onto a surface of the substrate outside the trench, and wherein the circuit wire pattern comprises a same material as the plug wire pattern.

10. The device of claim 8, wherein the circuit wire pattern extends from the plug portion of the plug wire pattern onto the surface of the substrate outside the trench, and wherein the circuit wire pattern comprises a different material as the plug wire pattern.

11. The device of claim 8, further comprising:
a wire capping pattern on the circuit wire pattern,
wherein the wire capping pattern exposes the recessed portion of the plug wire pattern.

12. The device of claim 1, wherein the substrate comprises a semiconductor substrate, wherein the plug wire pattern comprises a gate pattern, and further comprising:
a gate insulating layer in the wench on the sidewalls thereof and a surface therebetween such that the gate insulating layer is between the gate pattern and the trench, wherein the recessed portion of the gate pattern exposes portions of the gate insulating layer on the sidewalls of the trench; and
impurity diffusion regions in the active region of the substrate on opposite sides of the trench adjacent the gate pattern and having a different conductivity type than that of the substrate.

13. A method of forming an integrated circuit device, the method comprising:
forming a trench in a substrate having active regions and a device isolation layer, wherein the device isolation layer is formed to define the active regions and the trench is formed to traverse the active regions and the device isolation layer and to have a same depth in the active regions and the device isolation layer; and
forming a conductive plug wire pattern in the trench including a recessed portion that exposes portions of opposing sidewalls of the trench and an integral plug portion that protrudes from a surface of the recessed portion to provide an electrical connection to at least one other conductive wire pattern on a different level of metallization, wherein the recessed portion is formed to contact a first sidewall of the plug portion on one of the active regions along a direction of the trench, wherein a second sidewall of the plug portion opposite the first sidewall and a bottom surface of the plug portion are formed to contact a portion of the device isolation layer adjacent to the one of the active regions along the direction, and wherein a top surface of the plug portion is formed at a substantially same level as top surfaces of the active regions.

14. The method of claim 13, wherein forming the conductive plug wire pattern comprises:
forming a conductive layer in the trench;
forming a mask pattern on the conductive layer to expose a portion thereof; and
selectively recessing the exposed portion of the conductive layer to expose the portions of the opposing sidewalls of the trench and define the recessed portion of the conductive plug wire pattern and the plug portion protruding therefrom.

15. The method of claim 14, wherein forming the conductive layer comprises forming the conductive layer to substantially fill the trench, and wherein selectively recessing comprises selectively etching the exposed portion of the conductive layer such that the recessed portion of the plug wire pattern is below a surface of the substrate adjacent to and outside the trench and such that the top surface of the plug portion protrudes to a substantially same level as the surface of the substrate adjacent to and outside the trench.

16. The method of claim 15, wherein the surface of the substrate adjacent to and outside the trench comprises a major surface of the substrate.

17. The method of claim 14, wherein forming the conductive layer further comprises forming the conductive layer on a surface of the substrate outside the trench, and wherein recessing the exposed portion of the conductive layer further comprises recessing exposed portions of the conductive layer outside the trench to define a conductive circuit wire pattern on the plug portion of the conductive plug wire pattern. wherein the circuit wire pattern exposes the recessed portion of the plug wire pattern in the trench.

18. The method of claim 14, further comprising the following prior to forming the mask pattern:
forming a second conductive layer directly on the first conductive layer and on a surface of the substrate outside the trench.
wherein forming the mask pattern comprises forming the mask pattern on the second conductive layer to expose a portion thereof, and wherein recessing further comprises sequentially recessing the exposed portion of the second conductive layer and the first conductive layer to define a conductive circuit wire pattern directly on the plug portion of the conductive plug wire pattern, wherein the conductive circuit wire pattern exposes the recessed portion of the plug wire pattern in the trench.

19. The method of claim 18, wherein the second conductive layer and the first conductive layer comprise different materials.

20. The method of claim 18, further comprising the following prior to forming the mask pattern:
forming an insulating layer on the second conductive layer,
wherein forming the mask pattern comprises forming the mask pattern on the insulating layer to expose a portion thereof, and wherein recessing further comprises sequentially recessing the exposed portion of the insulating layer. the second conductive layer and the first conductive layer to define a wire capping pattern on the circuit wire pattern, wherein the wire capping pattern exposes the recessed portion of the plug wire pattern.

21. The method of claim 13, further comprising:
forming an insulating plug spacer layer in the trench on the surface of the recessed portion of the conductive plug wire pattern and on the first sidewall of the plug portion,
wherein the plug spacer layer substantially covers the portions of the opposing sidewalls of the trench exposed by the recessed portion of the plug wire pattern and exposes the top surface of the plug portion to provide the electrical connection with the at least one other conductive circuit wire pattern.

22. The method of claim 21, wherein forming the plug spacer layer comprises forming the plug spacer layer to fill the trench such that a surface thereof is at a substantially same level as surfaces of the substrate outside the trench on opposite sides thereof when viewed in a cross section perpendicular to the direction of the trench.

23. The method of claim 21, wherein the plug spacer layer comprises a different material than the substrate.

24. The method of claim 13, wherein the substrate comprises a semiconductor substrate, wherein the plug wire pattern comprises a gate pattern, and further comprising:
forming the device isolation layer on the substrate defining the active regions in the substrate prior to forming the trench in the substrate, wherein the trench extends through portions of the active regions and portions of the isolation layer;
forming a gate insulating layer in the trench on the sidewalls thereof and a surface therebetween prior to forming the gate pattern in the trench, wherein the recessed portion of the gate pattern exposes portions of the gate insulating layer on the sidewalls of the trench; and forming impurity diffusion regions in the active regions of the substrate on opposite sides of the trench adjacent the gate pattern and having a different conductivity type than that of the substrate.

25. An integrated circuit device, comprising:

a substrate including an elongated trench extending therein in a first direction; and a conductive plug wire pattern in the trench comprising a conductive layer including a recessed portion and an integral plug portion protruding from a surface of the recessed portion, wherein the recessed portion extends in the trench along the first direction and exposes portions of opposing sidewalls of the trench when viewed in a cross-section perpendicular to the first direction, and wherein the integral plug portion covers the opposing sidewalls of the trench and protrudes to a substantially same level as a surface of the substrate adjacent to and outside the trench when viewed in a cross-section perpendicular to the first direction to provide an electrical connection to at least one other conductive wire pattern on a different level of metallization, and wherein the integral plug portion is provided at an end of the trench and extends on an active region of the substrate and on a device isolation layer adjacent thereto.

26. The device of claim 25, further comprising:

an insulating plug spacer layer extending in the trench on the surface of the recessed portion of the conductive plug wire pattern and on a sidewall of the plug portion adjacent thereto, wherein the plug spacer layer fills the trench to substantially cover the portions of the opposing sidewalls of the trench exposed by the recessed portion of the plug wire pattern such that a surface of the insulating plug spacer is substantially planar with surfaces of the substrate outside the trench on opposite sides thereof when viewed in a cross section perpendicular to the first direction and exposes the surface of the plug portion to provide the electrical connection to the at least one other conductive wire pattern.

* * * * *